(12) United States Patent
Lin et al.

(10) Patent No.: US 10,468,495 B2
(45) Date of Patent: Nov. 5, 2019

(54) INTEGRATED CIRCUIT INCLUDING FERROELECTRIC MEMORY CELLS AND METHODS FOR MANUFACTURING

(71) Applicants: James Lin, New Haven, CT (US); Francesco Anthony Annetta, Cheshire, CT (US)

(72) Inventors: James Lin, New Haven, CT (US); Francesco Anthony Annetta, Cheshire, CT (US)

(73) Assignee: Alacrity Semiconductors, Inc., Branford, CT (US)

( * ) Notice: Subject to any disclaimer, the term of this patent is extended or adjusted under 35 U.S.C. 154(b) by 0 days.

(21) Appl. No.: 15/751,861

(22) PCT Filed: Aug. 11, 2016

(86) PCT No.: PCT/US2016/046625
§ 371 (c)(1),
(2) Date: Feb. 10, 2018

(87) PCT Pub. No.: WO2017/027744
PCT Pub. Date: Feb. 16, 2017

(65) Prior Publication Data
US 2018/0233573 A1 Aug. 16, 2018

Related U.S. Application Data

(60) Provisional application No. 62/203,816, filed on Aug. 11, 2015.

(51) Int. Cl.
*H01L 29/51* (2006.01)
*H01L 21/28* (2006.01)
(Continued)

(52) U.S. Cl.
CPC ...... *H01L 29/516* (2013.01); *H01L 21/28291* (2013.01); *H01L 27/11502* (2013.01); *H01L 28/56* (2013.01)

(58) Field of Classification Search
CPC ............... H01L 28/56; H01L 21/28291; H01L 27/11502; H01L 29/66666;
(Continued)

(56) References Cited

U.S. PATENT DOCUMENTS

| 8,304,823 B2 * | 11/2012 | Boescke | G11C 11/22 257/295 |
| 2008/0225569 A1 * | 9/2008 | Nawano | H01G 4/085 365/145 |

(Continued)

OTHER PUBLICATIONS

International search report for PCT/US2016/046625, dated Jan. 9, 2017, 2 pages.

(Continued)

*Primary Examiner* — Mark W Tornow
*Assistant Examiner* — Priya M Rampersaud
(74) *Attorney, Agent, or Firm* — Danielson Legal LLC

(57) ABSTRACT

Integrated circuits including a ferroelectric memory cell and methods for manufacturing the same. One embodiment of the memory cells include three main layers: a first oxide ferroelectric layer, a second oxide anti-ferroelectric layer, and a covering layer. The ferroelectric material of the first and second oxides include as main components oxygen and any of the group containing Hf, Zr, and (Hf, Zr).

18 Claims, 28 Drawing Sheets

(51) Int. Cl.
*H01L 49/02* (2006.01)
*H01L 27/11502* (2017.01)

(58) Field of Classification Search
CPC .......... H01L 27/11582; H01L 27/2454; H01L 29/0649; H01L 29/24; H01L 29/518; H01L 29/66969; H01L 29/785; H01L 29/78696; H01L 21/02181; H01L 21/0228; H01L 21/02532; H01L 21/28088; H01L 21/28097; H01L 23/535; H01L 27/0629; H01L 27/115; H01L 27/11514; H01L 27/11521; H01L 27/228; H01L 29/12; H01L 29/42336; H01L 29/4236; H01L 29/495; H01L 29/4966; H01L 29/4975; H01L 29/51; H01L 29/513; H01L 29/66977; H01L 29/78618; H01L 29/788; H01L 43/02; H01L 43/10; H01L 45/1206; H01L 45/142; H01L 45/143; H01L 2029/42388; H01L 21/02107; H01L 21/02189; H01L 21/02194; H01L 21/28194; H01L 21/3065; H01L 21/308; H01L 21/3083; H01L 21/3164; H01L 21/31645; H01L 21/762; H01L 21/76224; H01L 21/823431; H01L 21/823821; H01L 21/823878; H01L 27/085; H01L 27/0886; H01L 27/0924; H01L 27/10805; H01L 27/10852; H01L 27/1157; H01L 27/11578; H01L 27/11585; H01L 27/2463; H01L 28/00; H01L 28/75; H01L 29/06; H01L 29/0603; H01L 29/0653; H01L 29/0673; H01L 29/0688; H01L 29/1037; H01L 29/42384; H01L 29/42392; H01L 29/4908; H01L 29/66; H01L 29/66136; H01L 29/66181; H01L 29/66795; H01L 29/861; H01L 29/8613; H01L 29/94; H01L 45/065; H01L 45/16; H01L 21/02186; H01L 21/02197; H01L 21/02266; H01L 21/02271; H01L 21/2236; H01L 21/265; H01L 21/3105; H01L 27/11524; H01L 27/11556; H01L 27/2409; H01L 28/90; H01L 29/0669; H01L 29/511; H01L 29/66484; H01L 29/66833; H01L 29/784; H01L 29/7926; H01L 45/1233; H01L 45/1253; H01L 45/141; G11C 11/22; G11C 11/223; G11C 11/221

See application file for complete search history.

(56) References Cited

U.S. PATENT DOCUMENTS

| | | | | |
|---|---|---|---|---|
| 2009/0057737 | A1* | 3/2009 | Boescke | H01L 21/28291 |
| | | | | 257/295 |
| 2011/0002154 | A1* | 1/2011 | Mitani | G11C 13/0007 |
| | | | | 365/148 |
| 2014/0355328 | A1* | 12/2014 | Muller | G11C 11/2275 |
| | | | | 365/145 |
| 2017/0162587 | A1* | 6/2017 | Chavan | H01L 28/60 |

OTHER PUBLICATIONS

Written opinion for PCT/US2016/046625, dated Jan. 9, 2017, 4 pages.

* cited by examiner

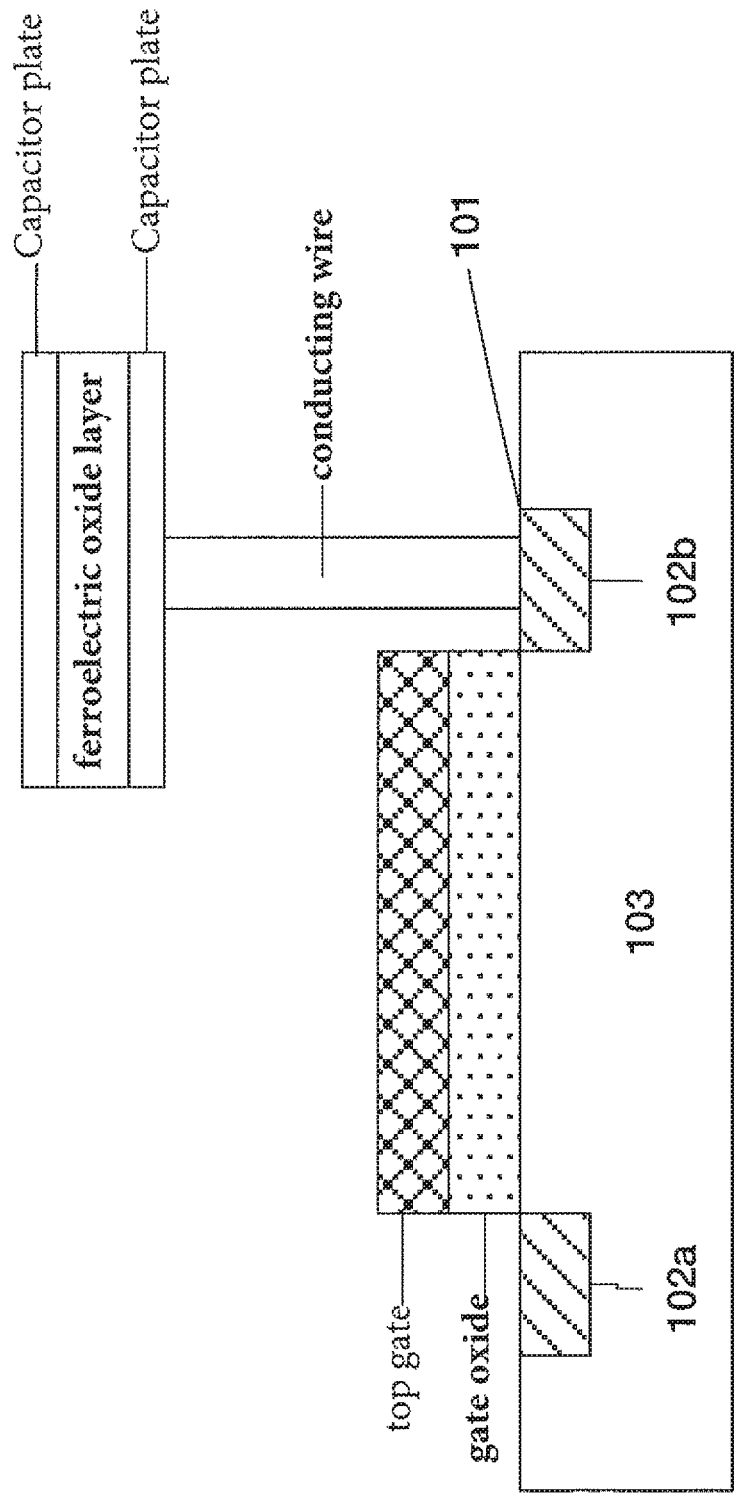

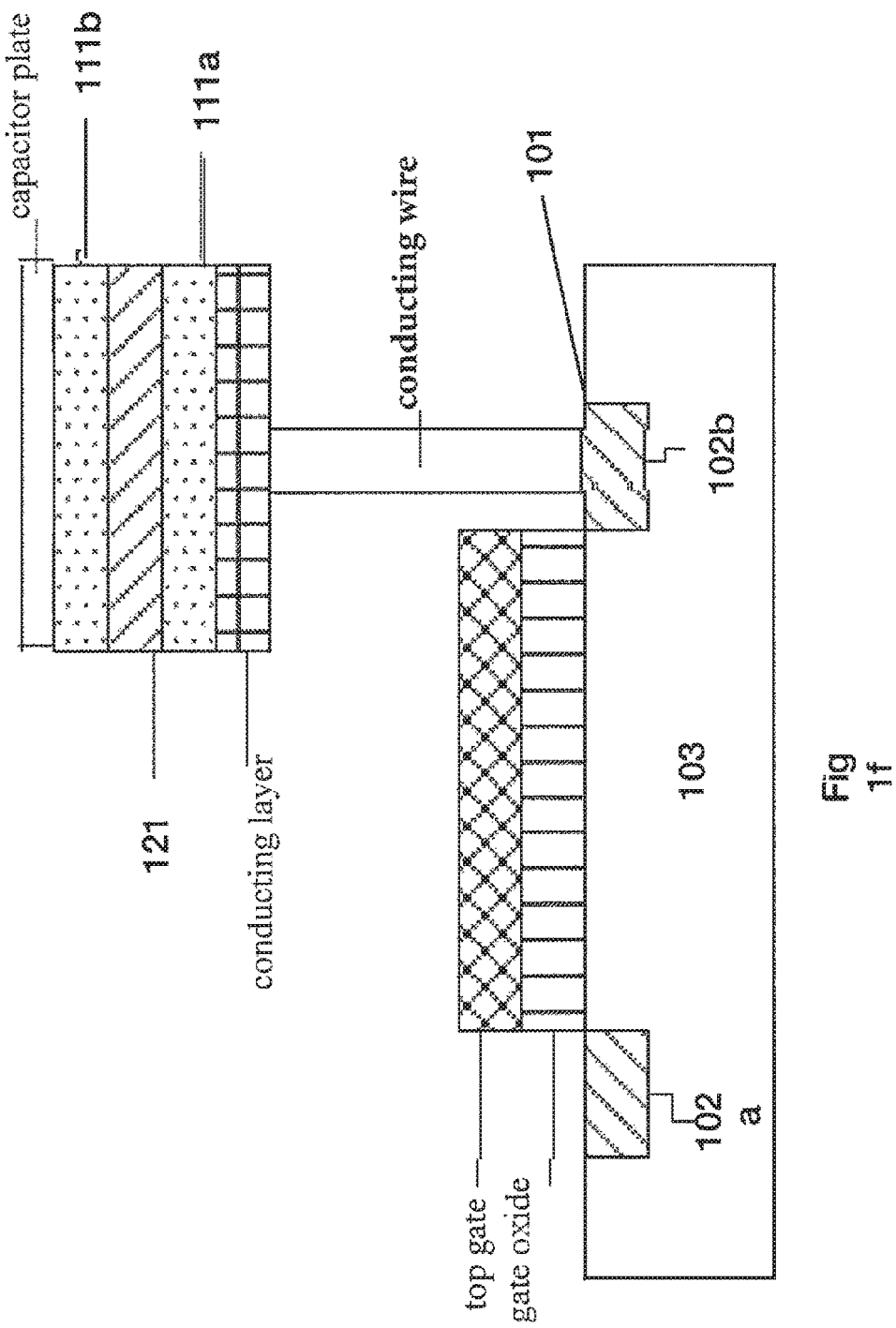

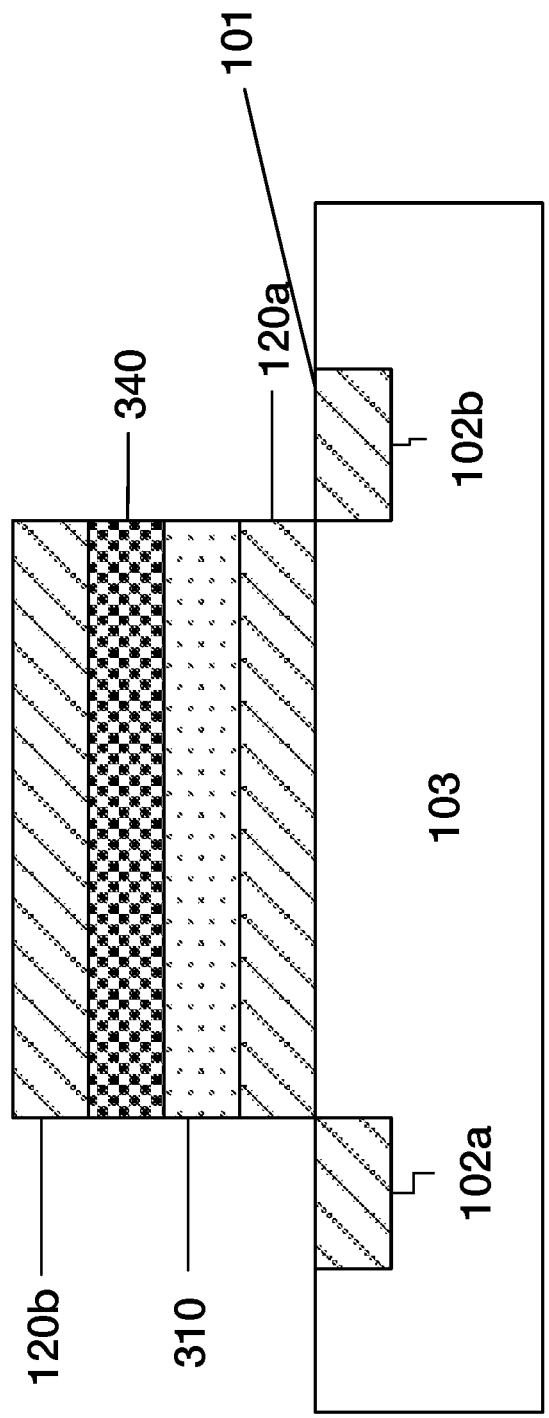

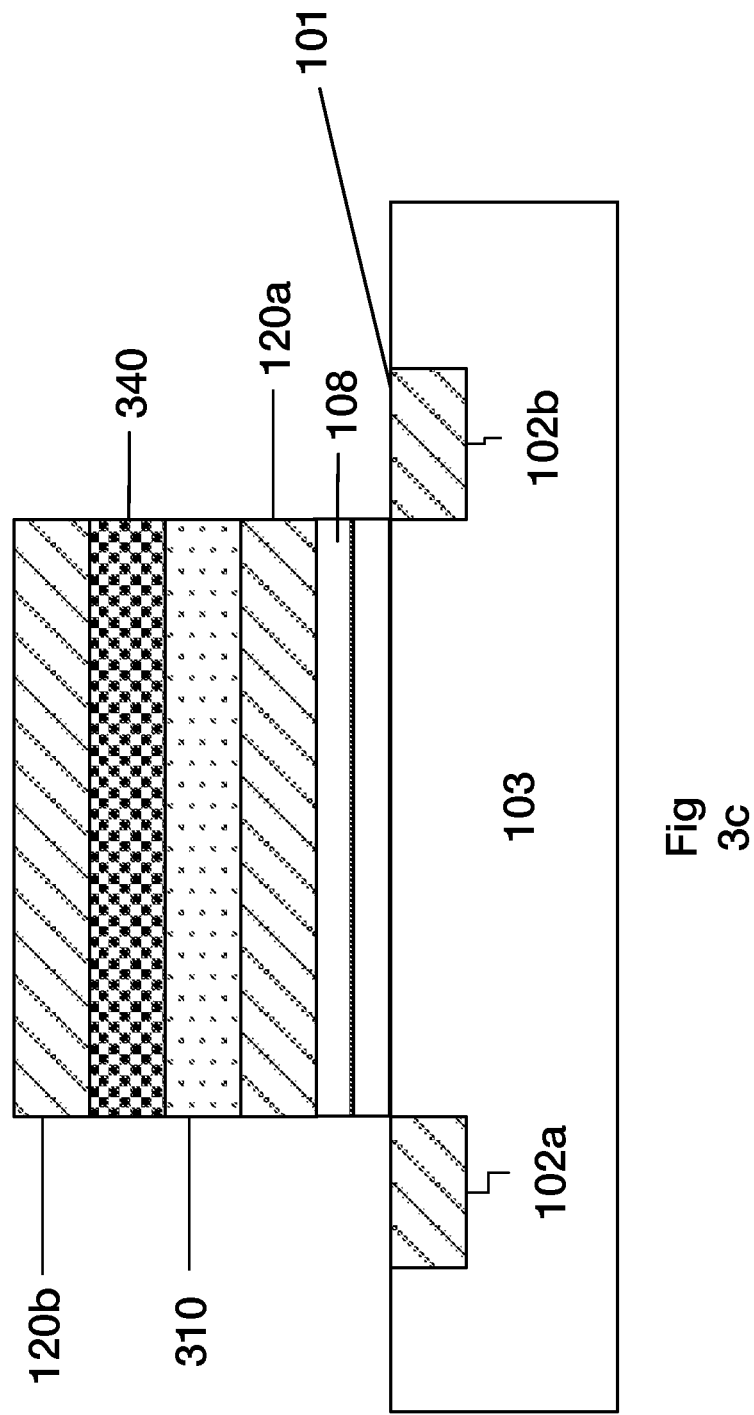

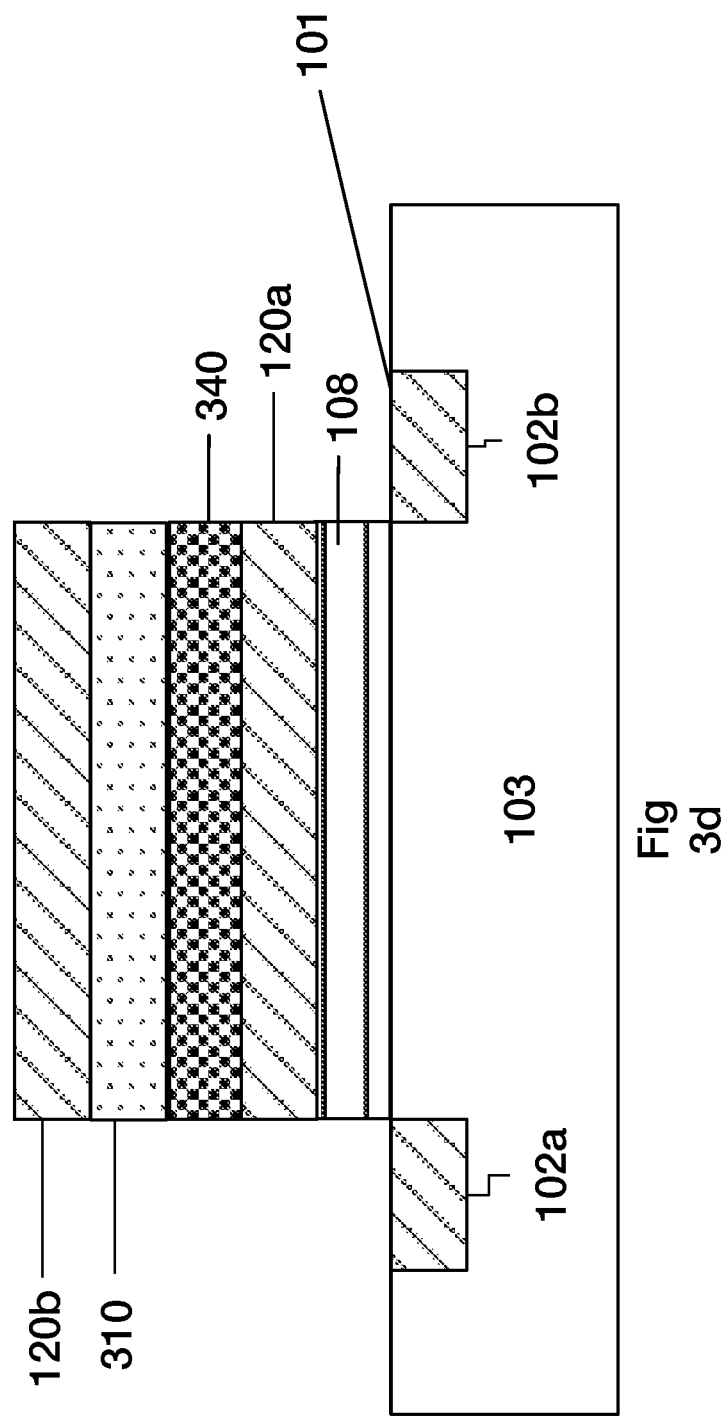

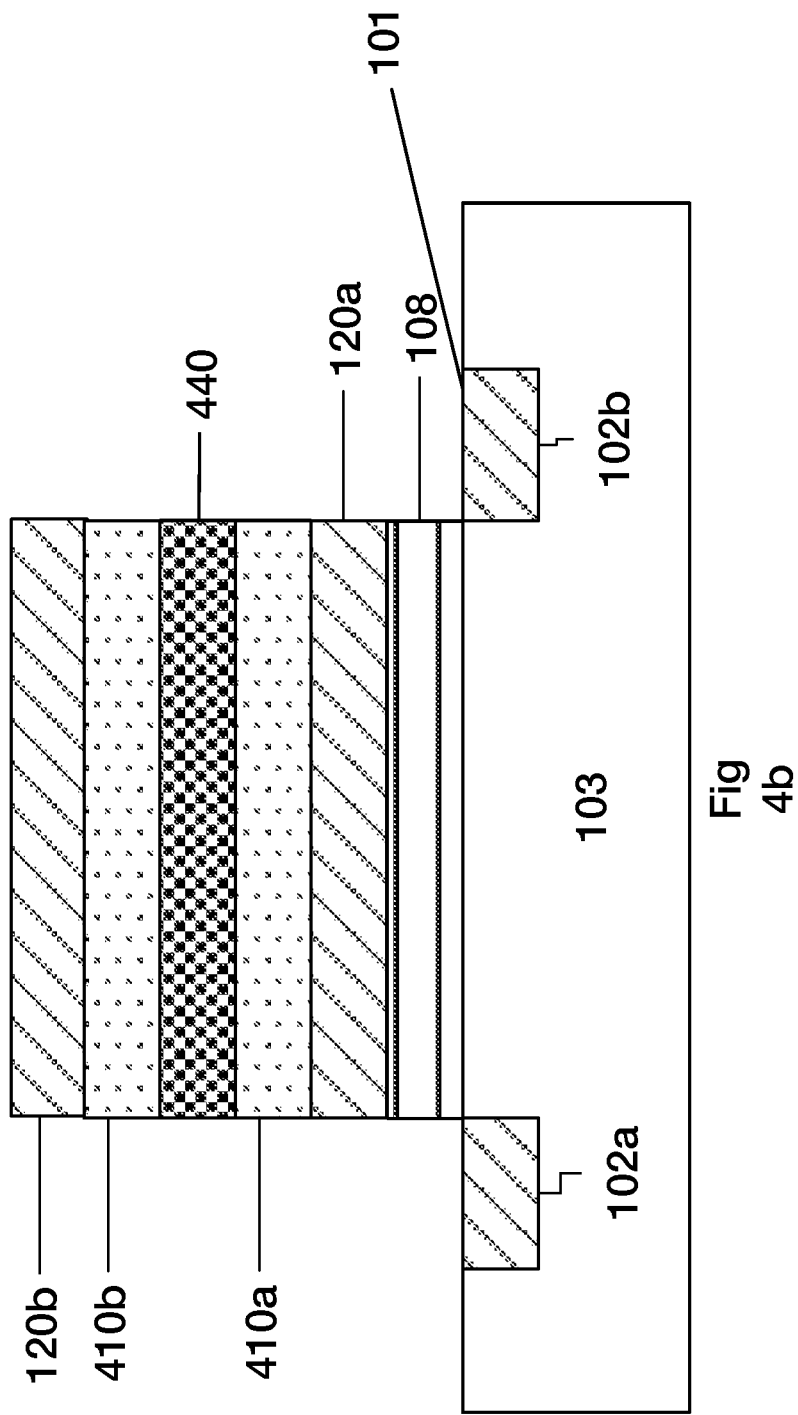

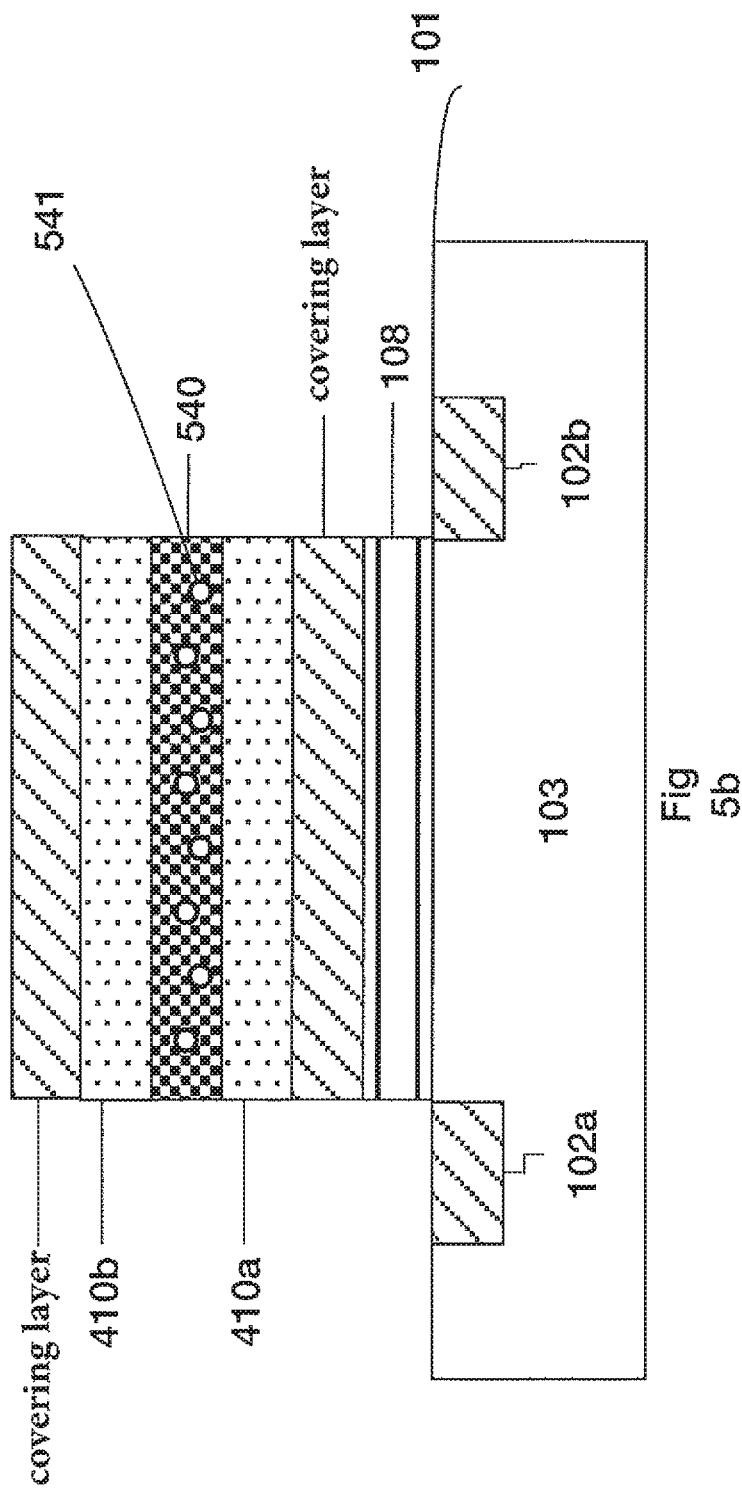

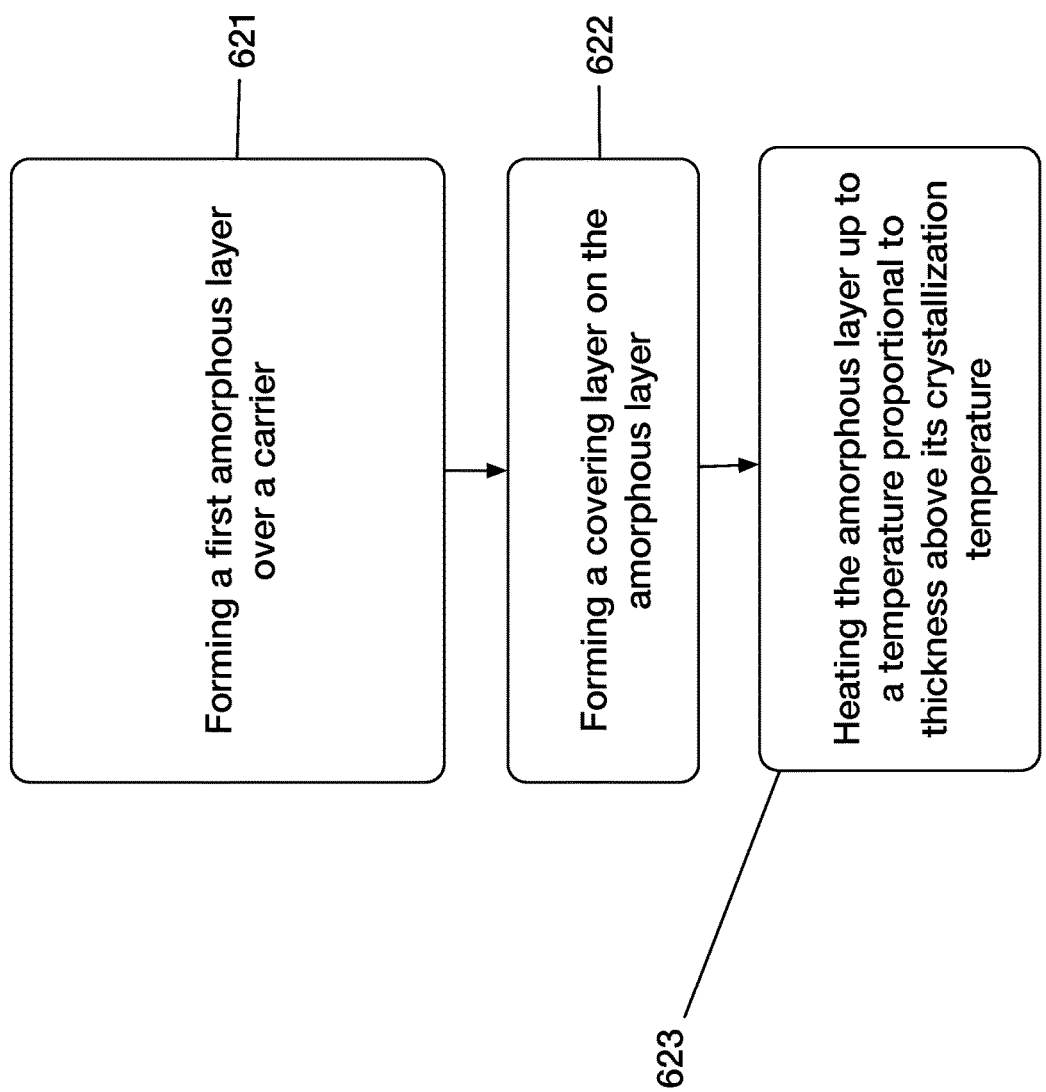

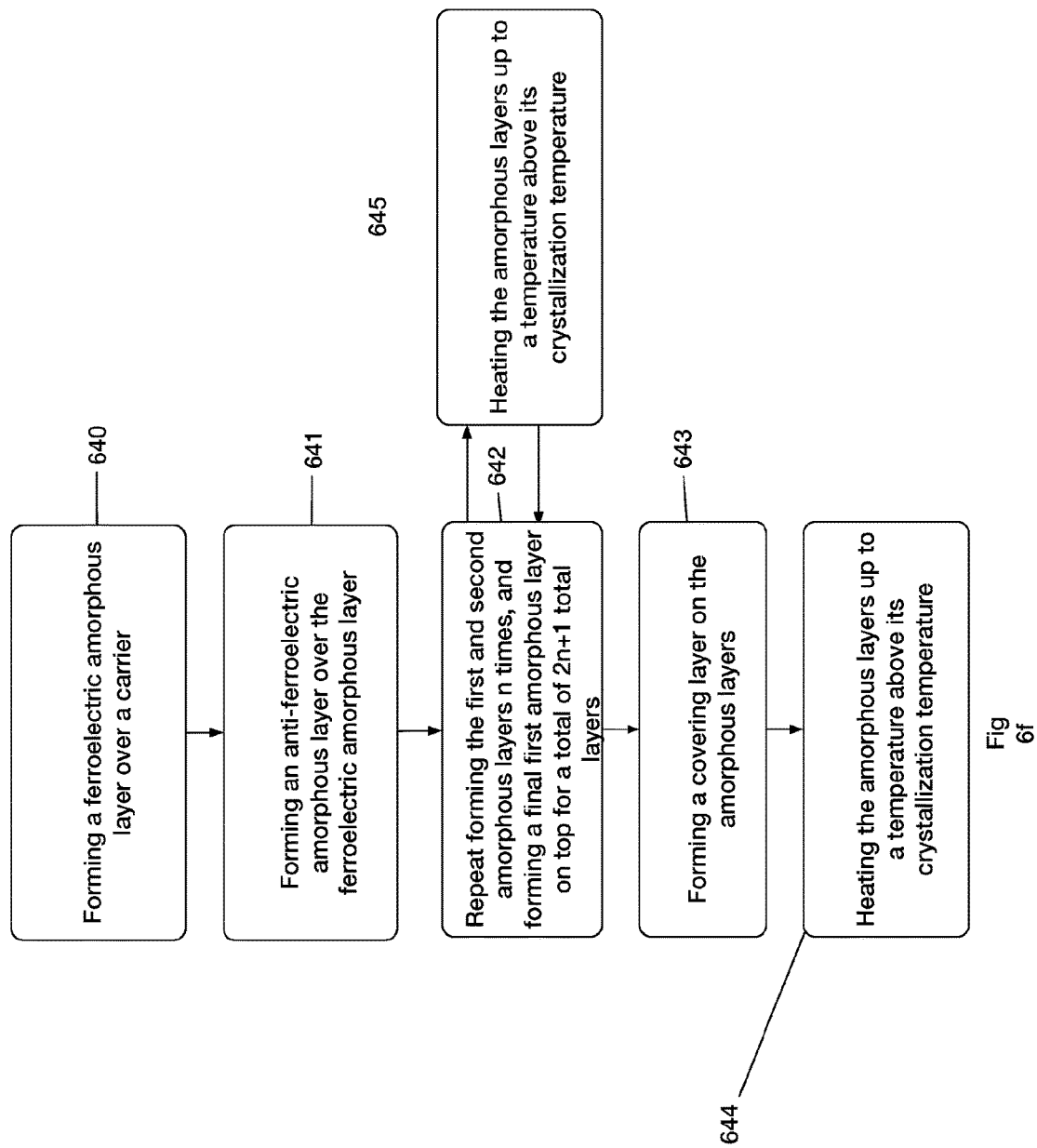

INTEGRATED CIRCUIT INCLUDING FERROELECTRIC MEMORY CELLS AND METHODS FOR MANUFACTURING

CROSS REFERENCE TO RELATED APPLICATIONS

The present application is the national phase of International (PCT) Patent Application No. PCT/US2016/046625, filed internationally on Aug. 11, 2016, and claims the benefit of U.S. provisional application No. 62/203,816, filed on Aug. 11, 2015, the entire disclosure of which is incorporated by reference as if set forth in its entirety herein.

TECHNICAL FIELD

This disclosure relates to an integrated circuit including a ferroelectric memory cell and methods of manufacturing the same.

BACKGROUND

In computing architectures, there is a need for memory to store information for later retrieval. These memories are normally referred to as Random Access Memory ("RAM") and are used for a variety of applications.

There are several approaches to implement RAM. Traditional methods such as Dynamic Random Access Memory ("DRAM") rely on an access transistor and a storage capacitor to store information, i.e., a 1T1C structure. Another approach, such as is used in Magnetoresistive Random Access Memory ("MRAM"), is to use a tunnel junction, which is a thin insulation barrier between two conductors. Other embodiments exist as well.

For example, a ferroelectric layer may be used to store information based on polarization within a crystal. This is referred to colloquially as Ferroelectric Random Access Memory ("FRAM" or "FeRAM"). Known implementations of FRAM include 1T1C, 2T2C, and 3T2C structures as well as a 1T structure. The 1T structure uses the access transistor with the ferroelectric layer embedded and is commonly referred to as a Ferroelectric Field Effect Transistor ("FeFET").

SUMMARY

Several embodiments herein are described for a ferroelectric memory cell and methods for methods of manufacturing the same. The ferroelectric memory cell contains a first oxide ferroelectric storage layer, a second oxide anti-ferroelectric layer, and an amorphous layer. The ferroelectric material of the first and second oxides include as main components oxygen and any of the group containing Hf, Zr, and (Hf, Zr).

These circuits can be applied to all known structure embodiments of FRAM, but the discussion below focuses specifically on FeFETs.

In one aspect, embodiments of the present invention relate to an integrated circuit comprising a ferroelectric memory cell, the ferroelectric memory cell comprising a first oxide layer; a second oxide layer; a third oxide layer; and a covering layer on at least one oxide layer. The first and third oxide layers comprise a material that is at least partly in a ferroelectric state and comprises, as main components, oxygen and any of the group consisting of Hf, Zr, and (Hf, Zr). The second oxide layer is disposed between the first and third oxide layers; and comprises a material that is at least partially in an antiferroelectric state.

In one embodiment, the second oxide layer is at least partially in an amorphous state.

In one embodiment, the first and third oxide layers comprise further additives of a concentration within a range of 0.5% to 6.75% and the additives are at least one of the C, Si, Al, Ge, Sn, Sr, Pb, Mg, Ca, Sr, Ba, Ti, Zr, Ti, and one or more rare earth elements.

In one embodiment, the second oxide layer overlies the first; the third oxide layer overlies the first and second; and the covering layer comprises at least one of TiN, TaN, TaCN, WCN, Ru, Re, RuO, Pt, Ir, IrO, Ti, TiAlN, TaAlN, W, WN, C, Si, Ge, SiGe, and NbCN.

In one embodiment, the second oxide layer contains nanodots comprising a ferroelectric material that is at least partly in a ferroelectric state and comprising, as main components, oxygen and any of the group consisting of Hf, Zr, and (Hf, Zr).

In one embodiment, the second oxide layer comprises further additives of a concentration within a range of 0.5% to 20% and the additives are at least one of the C, Si, Al, Ge, Sn, Sr, Pb, Mg, Ca, Sr, Ba, Ti, Zr, Ti, and one or more rare earth elements.

In one embodiment, the thicknesses of the first and third oxide layers are in the range of 1 Angstrom to 150 Angstroms.

In one embodiment, the first and third oxide layers are about the same thickness.

In one embodiment, the first and third oxide layers have different thicknesses.

In one embodiment, the first and third oxide layers have separate polarization states.

In one embodiment, the second and third oxide layers form a stacking layer; a plurality of stacking layers forms a system that overlies the first oxide layer; and the orientation of the stacking layers is such that the second oxide layer is always adjacent to a first or third oxide layer. In one embodiment, the first oxide layer and each stacking layer have separate polarization states.

In one embodiment, the first and third oxide layers comprise further additives of a concentration within a range of 0.5% to 6.75% and the additives are at least one of the C, Si, Al, Ge, Sn, Sr, Pb, Mg, Ca, Sr, Ba, Ti, Zr, Ti, and one or more rare earth elements.

In one embodiment, the first oxide layer overlies the second and third oxide layers, and the covering layer comprises at least one of TiN, TaN, TaCN, WCN, Ru, Re, RuO, Pt, Ir, IrO Ti, TiAlN, TaAlN, W, WN, C, Si, Ge, SiGe, and NbCN.

In one embodiment, the thicknesses of the first and third oxide layers are in the range of 1 Angstrom to 150 Angstroms In one embodiment, the first and third oxide layers are about the same thickness.

In one embodiment, the first and third oxide layers have different thicknesses.

In one embodiment, the first and third oxide layer have separate polarization states.

In another aspect, embodiments of the present invention relate to an integrated circuit comprising a ferroelectric memory cell, the ferroelectric memory cell comprising an oxide layer being at least partly in a ferroelectric state and comprising, as main components, oxygen and any of the group consisting of: Hf, Zr, and (Hf, Zr); and a covering layer on the oxide layer comprising of at least one of TiN, TaN, TaCN, WCN, Ru, Re, RuO, Pt, Ir, IrO, Ti, TiAlN, TaAlN, W, WN, C, Si, Ge, SiGe, and NbCN. The thickness of the oxide layer is in the range of 1 Angstrom to 150 Angstroms; and the oxide layer comprises further additives of a concentration within a range of 0.5% to 6.75% and the additives are at least one of the group C, Si, Al, Ge, Sn, Sr, Pb, Mg, Ca, Sr, Ba, Ti, Zr, Ti, and one or more rare earth elements.

Any combination and permutation of embodiments is envisioned. Other objects and features will become apparent from the following detailed description considered in conjunction with the accompanying drawings. It is to be understood, however, that the drawings are designed as an illustration only and not as a definition of the limits of the present disclosure.

BRIEF DESCRIPTION OF THE DRAWINGS

Exemplary embodiments of the present disclosure will be understood from the following detailed description when read with the accompanying Figures. In the drawings, like reference numerals refer to like parts throughout the various views of the non-limiting and non-exhaustive embodiments of the present invention, and wherein:

FIG. 1e illustrates a cross-sectional view of a prior embodiment of a 1T1C ferroelectric memory cell where the ferroelectric layer is in the capacitor;

FIG. 1f illustrates a cross-sectional view of a prior embodiment of a MFM 1T1C ferroelectric memory cell where the ferroelectric layer is in the capacitor;

FIG. 3a illustrates a cross-sectional view of one embodiment of an FeFET with an anti-ferroelectric layer in accordance with the invention;

FIG. 3c illustrates a cross-sectional view of a third embodiment of the FeFET with an anti-ferroelectric layer in accordance with the invention;

FIG. 3d illustrates a cross-sectional view of a fourth embodiment of the FeFET with an anti-ferroelectric layer in accordance with the invention;

FIG. 4b illustrates a cross-sectional view of a second embodiment of a MFM FeFET in accordance with the invention;

FIG. 5b illustrates a cross-sectional view of the embodiment of FIG. 4b with additional nano-dots;

FIG. 6b illustrates a method of manufacturing the embodiments of FIGS. 2a to 2f;

FIG. 6f illustrates another approach to manufacture an integrated circuit containing a ferroelectric memory cell based on the embodiments of FIGS. 4a and 4b;

DETAILED DESCRIPTION

It is to be understood that not every use case in accordance with the embodiments is described herein. The core ideas described can be combined with other memory structures using the same ideas to form additional embodiments.

A first aspect of the present invention concerns a method for manufacturing an integrated circuit including a ferroelectric memory cell. The ferroelectric is formed as a first amorphous layer having as main components O and any of the group of Hf, Zr, and (Hf, Zr).

A second aspect of the present invention concerns the inclusion of an anti-ferroelectric amorphous layer in a ferroelectric memory cell. This layer is also formed from main component, O and any of the group of Hf, Zr, and (Hf, Zr). This layer differs from the first amorphous layer mentioned above due to a different concentration of additives.

A third aspect of the present invention concerns adding nanodots within the anti-ferroelectric amorphous layer. These nanodots are made of a similar material as the first amorphous layer and are contained within the anti-ferroelectric layer to assist in conduction. For purposes of clarification, "similar material" means that the main components are O and any of the group of Hf, Zr, and (Hf, Zr), and can contain the same or different concentration of additives so long as the additives do not exceed approximately 20%.

FIGS. 1a to 1f illustrate embodiments of known prior art FeFETs or FRAM using the same materials (i.e., an O with any of the group of Hf, Zr, and (Hf, Zr)).

Figure 1A:
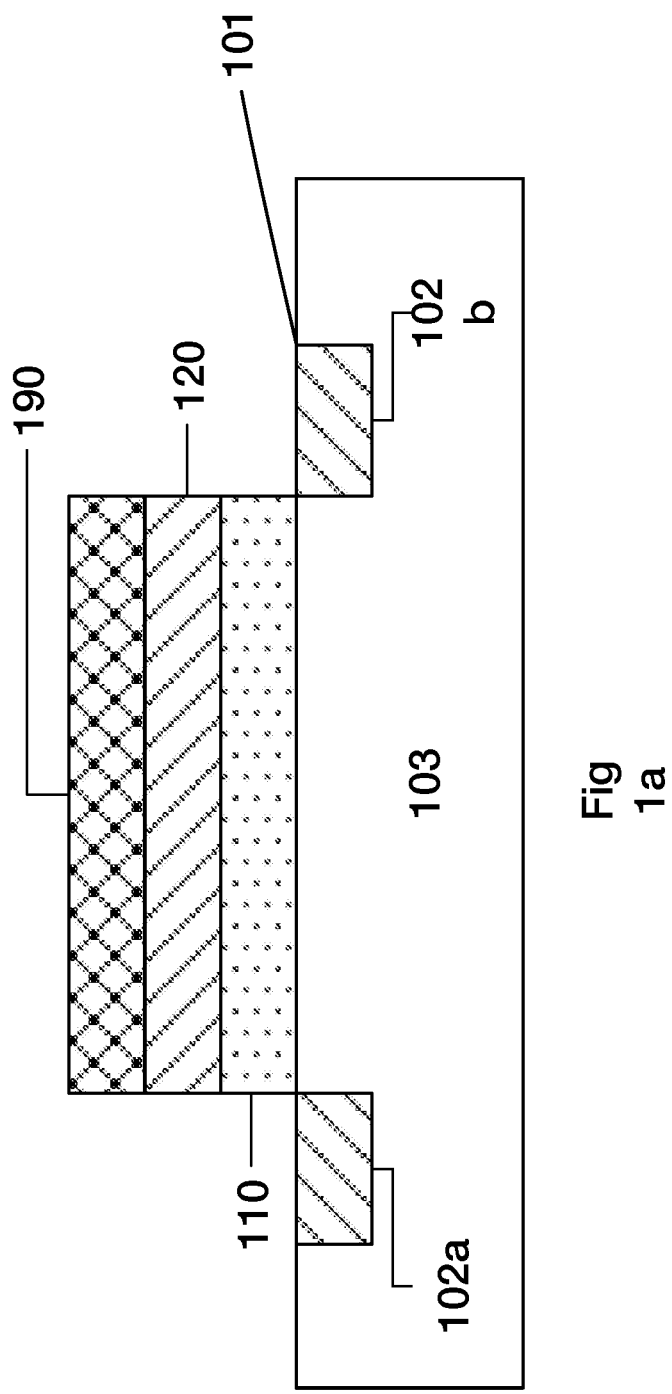
FIG. 1a illustrates a cross-sectional view of a prior embodiment of an FeFET having an amorphous ferroelectric layer, a covering layer, and a top gate.
Figure 1B:
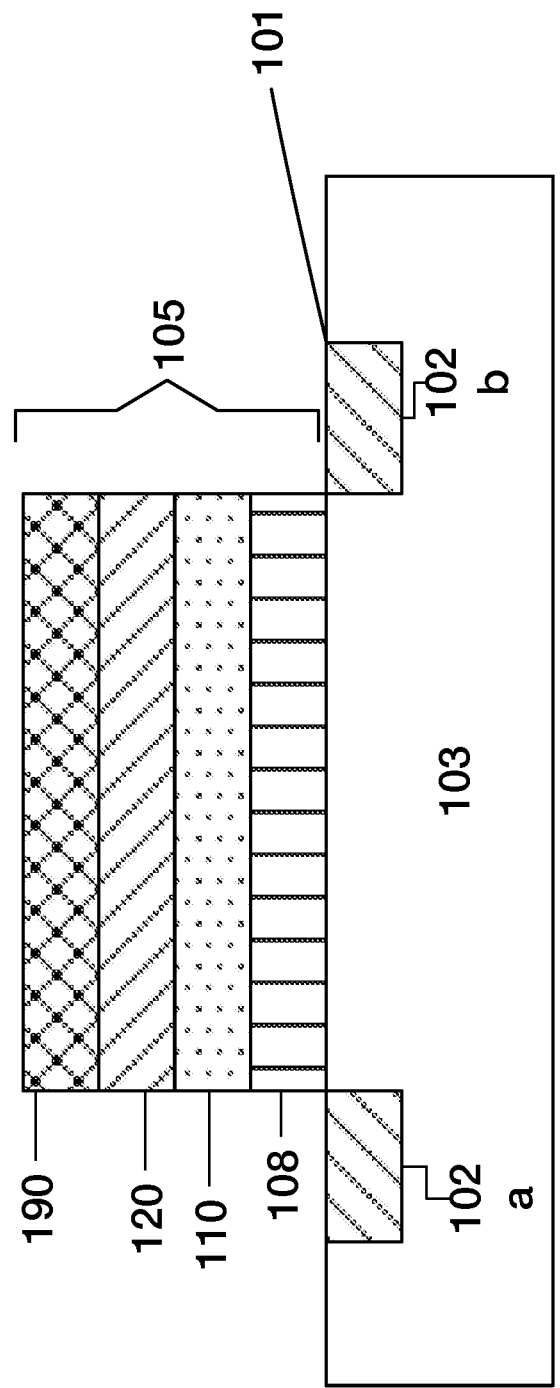
FIG. 1b illustrates a cross-sectional view of a prior embodiment of an FeFET having an insulating buffer, an amorphous ferroelectric layer, a covering layer, and a top gate.

In FIG. 1b, the ferroelectric memory cell 101 includes source and drain regions 102a and 102b formed within the carrier 103. There is a gate layer stack 105 over the carrier 103 which is formed of an insulating buffer layer 108, a crystallized oxide layer 110, a covering layer 120, and a top gate 190. The top gate 190 is optional and only depicted in FIGS. 1a and 1b.

Figure 1C:
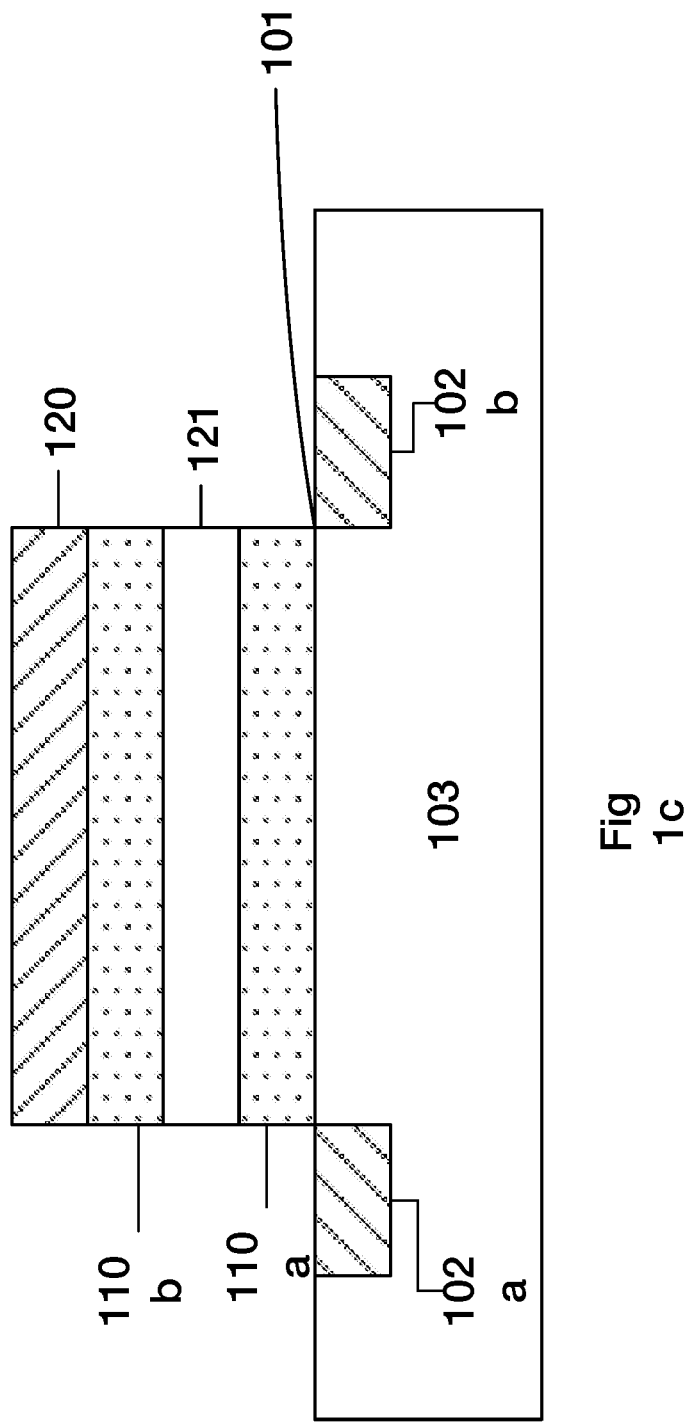
FIG. 1c illustrates a cross-sectional view of a prior embodiment of the metal ferroelectric semiconductor ("MFS") FeFET structure.
Figure 1D:
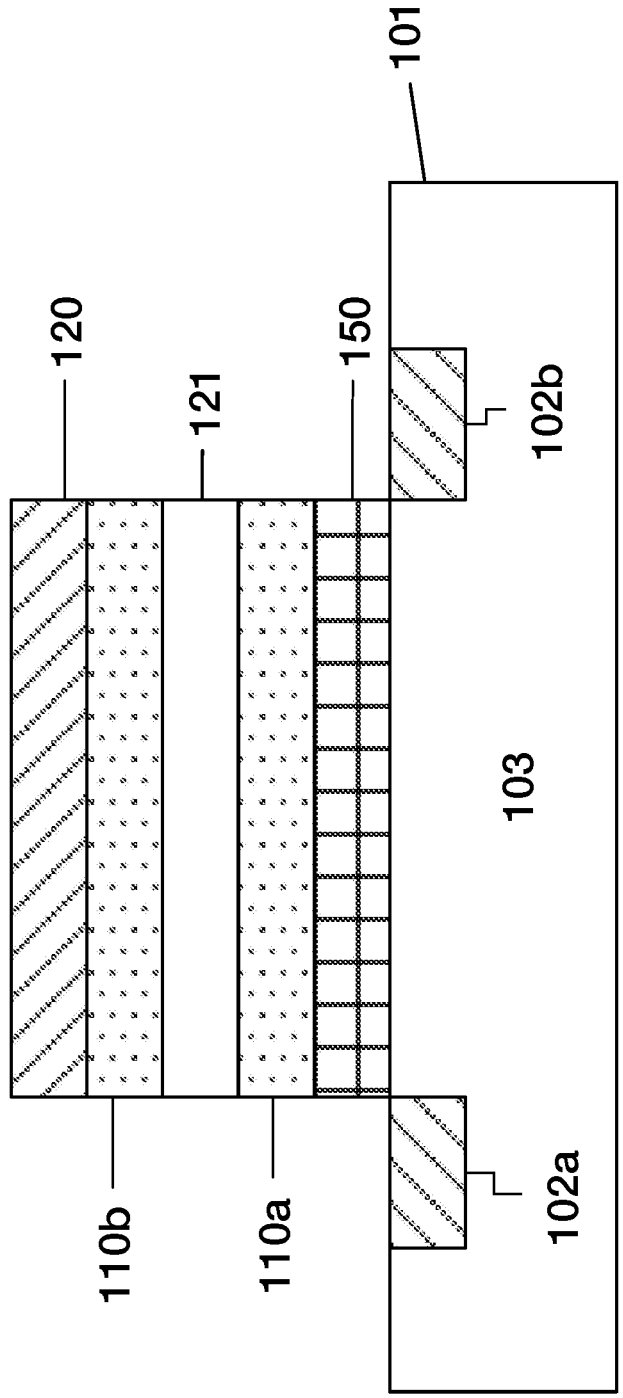
FIG. 1d illustrates a cross-sectional view of a prior embodiment of the metal ferroelectric metal ("MFM") FeFET structure.
Figure 2A:
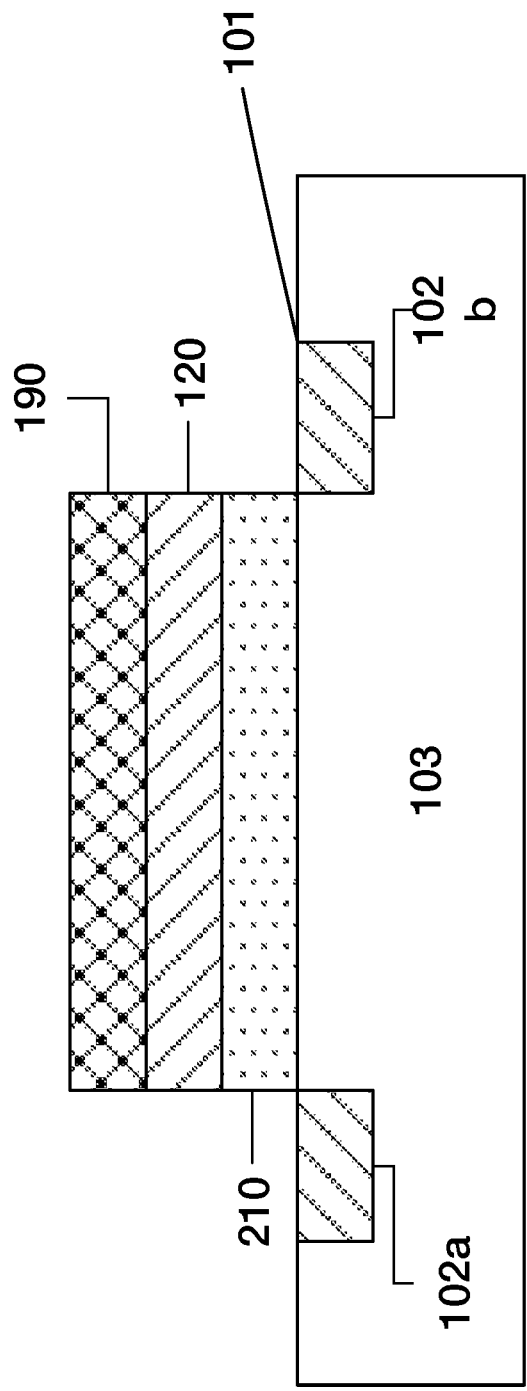
FIG. 2a shows the embodiment of FIG. 1a with an amorphous ferroelectric layer in accordance with the invention.
Figure 2B:
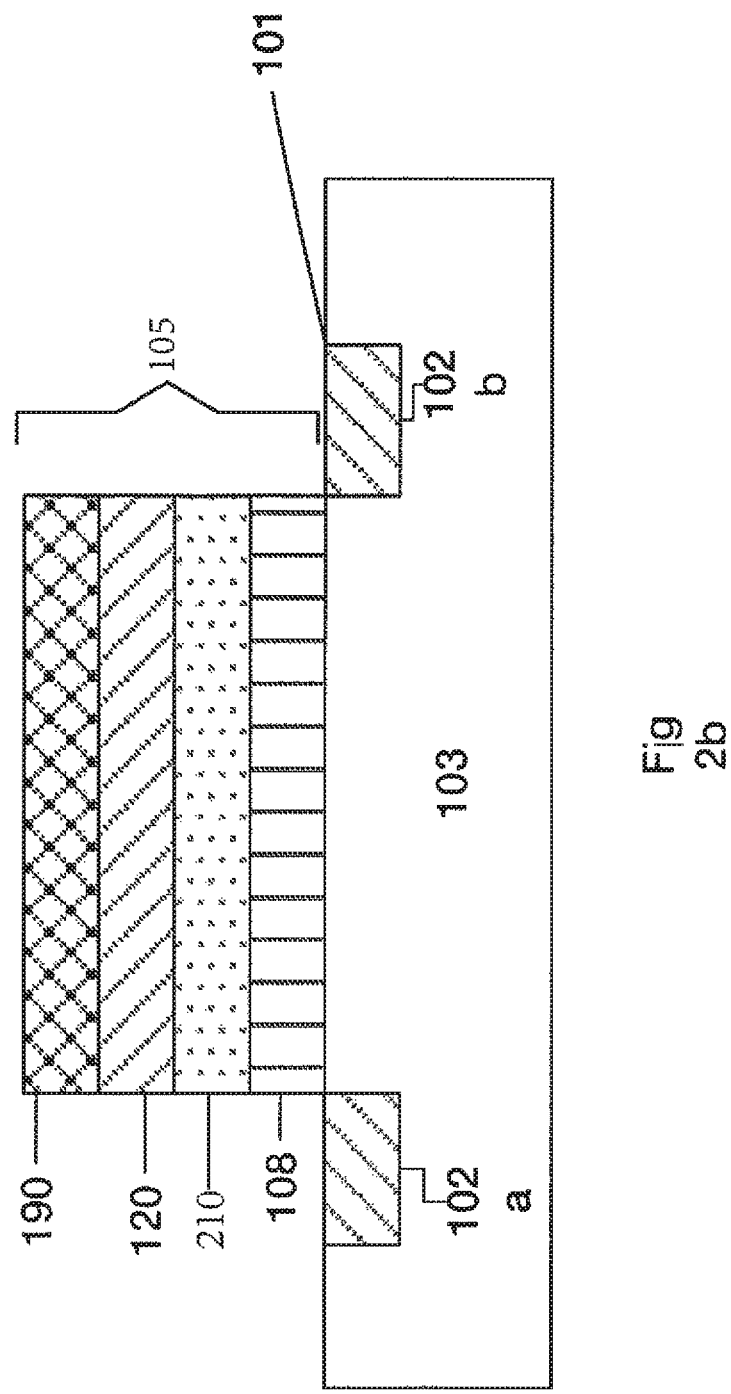
FIG. 2b shows the embodiment of FIG. 1b with an amorphous ferroelectric layer in accordance with the invention.
Figure 2C:
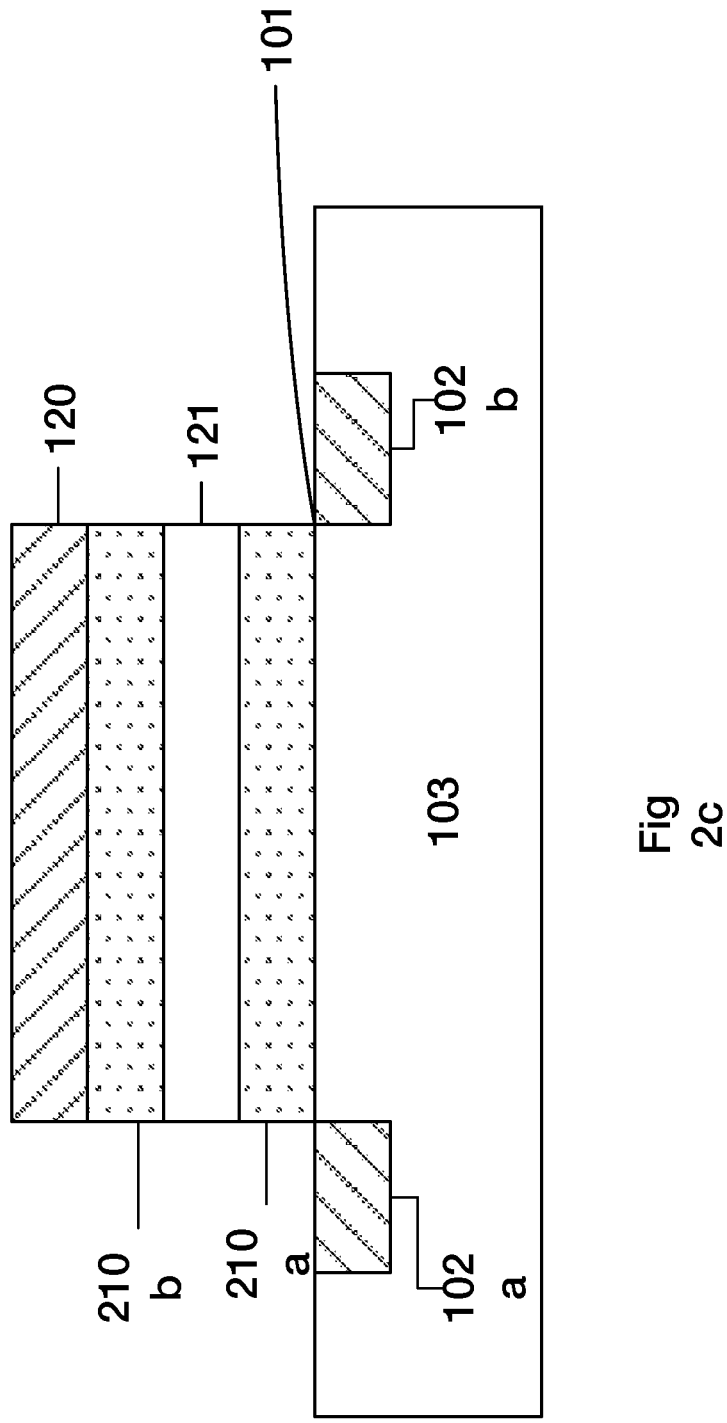
FIG. 2c shows the embodiment of FIG. 1c with an amorphous ferroelectric layer in accordance with the invention.
Figure 2D:
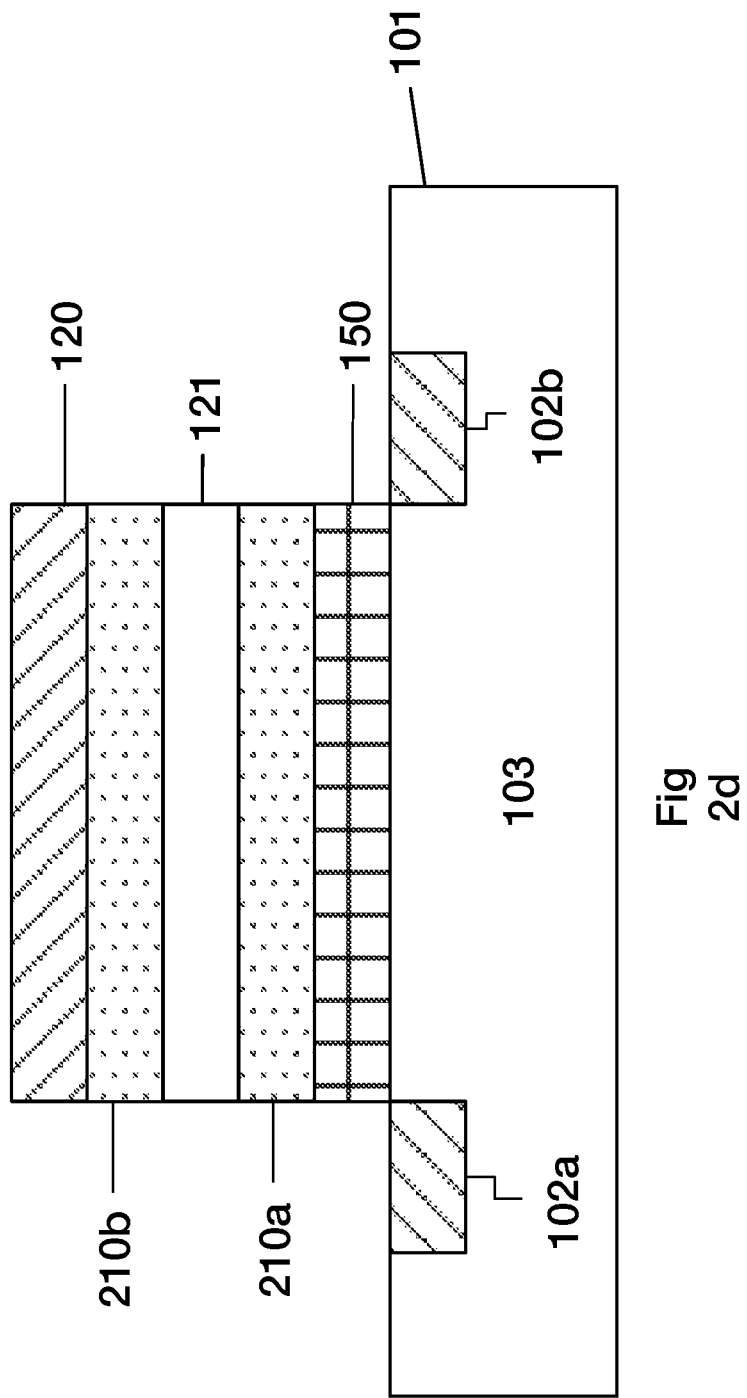
FIG. 2d shows the embodiment of FIG. 1d with an amorphous ferroelectric layer in accordance with the invention.
Figure 2E:
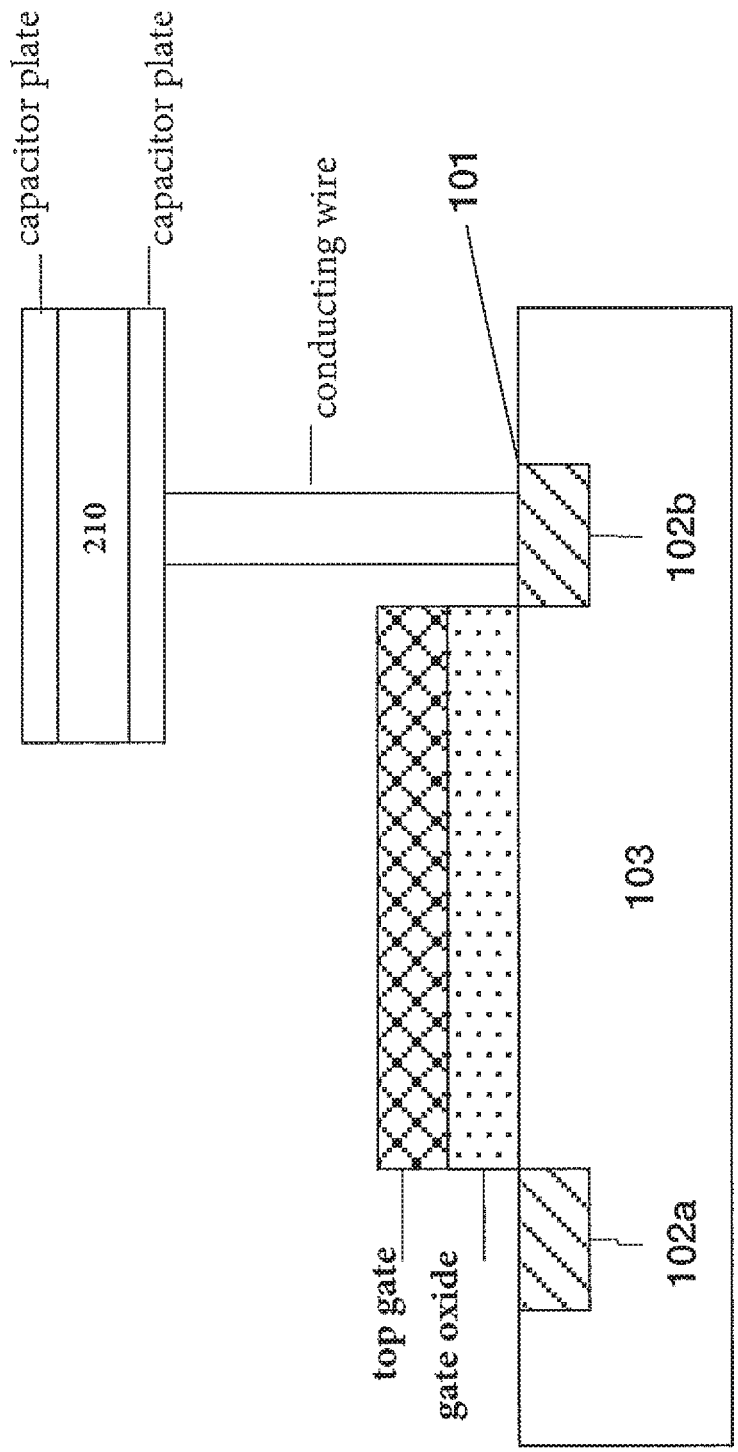
FIG. 2e shows the embodiment of FIG. 1e with an amorphous ferroelectric layer in accordance with the invention.
Figure 2F:
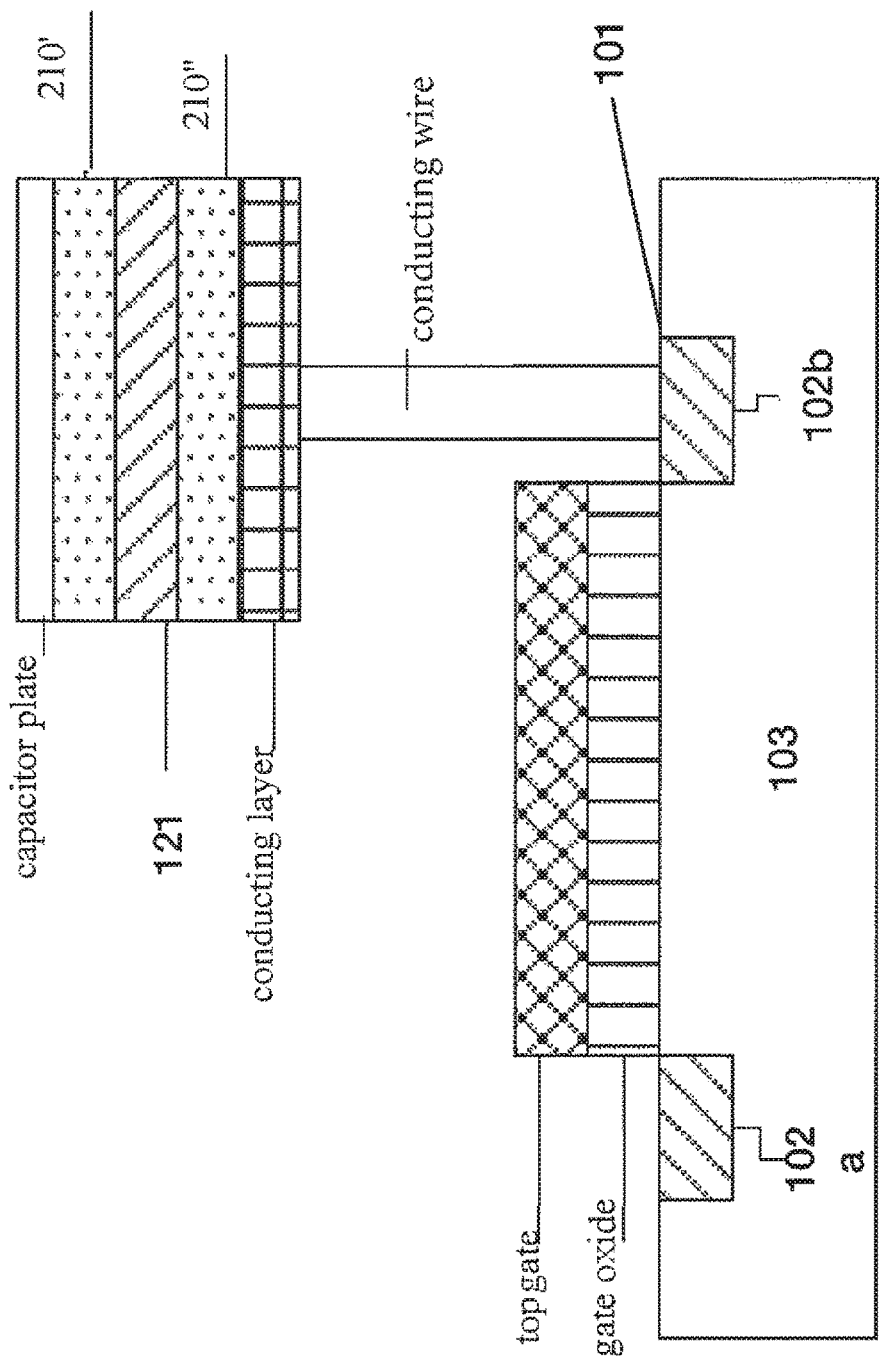
FIG. 2f shows the embodiment of FIG. 1f with an amorphous ferroelectric layer in accordance with the invention.

FIGS. 1a through 1d illustrate variations of this basic structure. FIG. 1a does not include the insulating buffer layer 108 of FIG. 1b. FIGS. 1c and 1d could have an insulating buffer layer, but it is not shown.

FIGS. 1c and 1d illustrate the MFS and MFM variants. In these variants, there are 2 crystallized oxide layers 110 a and 110 b that are separated by a different amorphous oxide layer 121, a conducting layer 150, and a conductive covering layer 120.

FIGS. 1e and 1f illustrate a FRAM using a crystallized oxide layer. This is depicted by 110 in FIG. 1e and 111a and 111b in FIG. 1f. Note that in 1f, this is a MFM configuration within the capacitor.

The process of creating a crystallized oxide layer is known to one skilled in the art. We summarize here for discussion purposes. The carrier 103 is composed of Si, a Si compound such as SiGe, silicon-on-insulator (SOI), III-V semiconductor compounds such as GaAS or any other suitable substrate material. Components and devices may already be formed on the carrier. The amorphous layer is formed by atomic layer deposition ("ALD"), metal organic atomic layer deposition ("MOALD"), chemical vapor deposition ("CVD"), metal organic chemical vapor deposition ("MOCVD"), physical vapor deposition ("PVD"), or any other suitable deposition technique providing an amorphous layer.

The thickness of the amorphous layer can be in the range of 2 nm to 100 nm, or the thickness of the entire gate stack 105 to be between 2 nm to 250 nm. In the embodiments disclosed in FIGS. 2a to 2f, we note that advances in the previously described processes (ALD, MOALD, CVD, MOCVD, PVD, and other depositions method) enable thinner layers from 1 Angstrom to 150 angstroms. This change in amorphous layer thickness, i.e., the thinner layer, is denoted as 210 in the FIGS. 2a through 2f.

The materials of the crystalline layer are composed primarily of O and any of Hf, Zr, and (Hf, Zr). This means that the volumetric content of these elements per cell is higher compared to any other component or further additives. One who is skilled in the art will note that the concentration of additives is typically within a range of 0.5% to 6.75%. A higher concentration of additives will typically result in crystallization that is not ferroelectric. It will also be appreciated that the concentration of additives is related to the thickness of the amorphous layer as described previously. That is, in increasing the thickness of the amorphous layer, the concentration of additives is increased.

The additives used in this and the other embodiments described herein include any suitable additives that are included within the material oxide layer including, without limitation, any one or more of C, Si, Al, Ge, Sn, Sr, Pb, Mg, Ca, Sr, Ba, Ti, Zr (providing Zr as an additive to an HfO2 layer), Ti, and any one or more of the rare earth elements (Y, Gd, etc.).

Further, one skilled in the art will note that previously the temperature range chosen for heating the amorphous layer was in the range of 400° C. to 1200° C. In the embodiments disclosed, it is found that heating the amorphous layer in a range from 100° C. to 1100° C. is preferable in certain circumstances in fabrication. One who is skilled in the art will note that in choosing a lower temperature, the heating time will be longer. The purpose of the heating step remains to form crystallization in the amorphous layer.

Additionally, there is a covering layer that is formed over the amorphous layer that assists in the transition from the amorphous state to the crystalline state. The heating of the amorphous layer to alter its crystal state may be affected by a particular anneal or may be carried out in a standard anneal of a respective semiconductor manufacturing process.

FIG. 3a illustrates one embodiment of the invention. In this embodiment, the source and drain 102a and 102b and the carrier 103 are as previously described. Within the gate stack, there are several changes. The first is that the covering layer forms the layer 120a and is then followed by a crystallized ferroelectric oxide layer 310, a crystallized anti-ferroelectric oxide layer 340, and then another covering layer 120b. The crystallized oxide layer remains as described previously and is denoted by 310 to signify the difference in thickness from the prior art. In addition, this embodiment introduces the use of an anti-ferroelectric layer 340.

The anti-ferroelectric layer 340 is formed primarily of O and any of Hf, Zr, and (Hf, Zr). This means that the volumetric content per cell of these elements is higher compared to any other component or further additives. To achieve anti-ferroelectricity, the concentration of additives is typically set within a range of 7% to 25%. We refer to this layer as being anti-ferroelectric because the formulation of the layer forms a crystallized oxide layer wherein the dipoles oppose that of a ferroelectric crystallized oxide. This opposed alignment prevents charge from escaping the ferroelectric layer, and thus acts as a charge trapping layer.

The thickness of the crystallized anti-ferroelectric layer 340 is either the same or greater than the thickness of the crystallized ferroelectric layer 310. This means that its thickness can range from 1 Angstrom to 300 Angstroms.

Including the anti-ferroelectric layer 340 improves the electrical properties of the ferroelectric memory cell. In previous embodiments, charge trapping is accomplished through the covering layer. However, using the covering layer is not ideal because it is conductive, which is a different electrical property than being ferroelectric. Using a conductor for charge trapping is not using the proper tool to accomplish the job. By creating an anti-ferroelectric layer, the correct tool is employed to achieve the desired result.

Figure 3B:
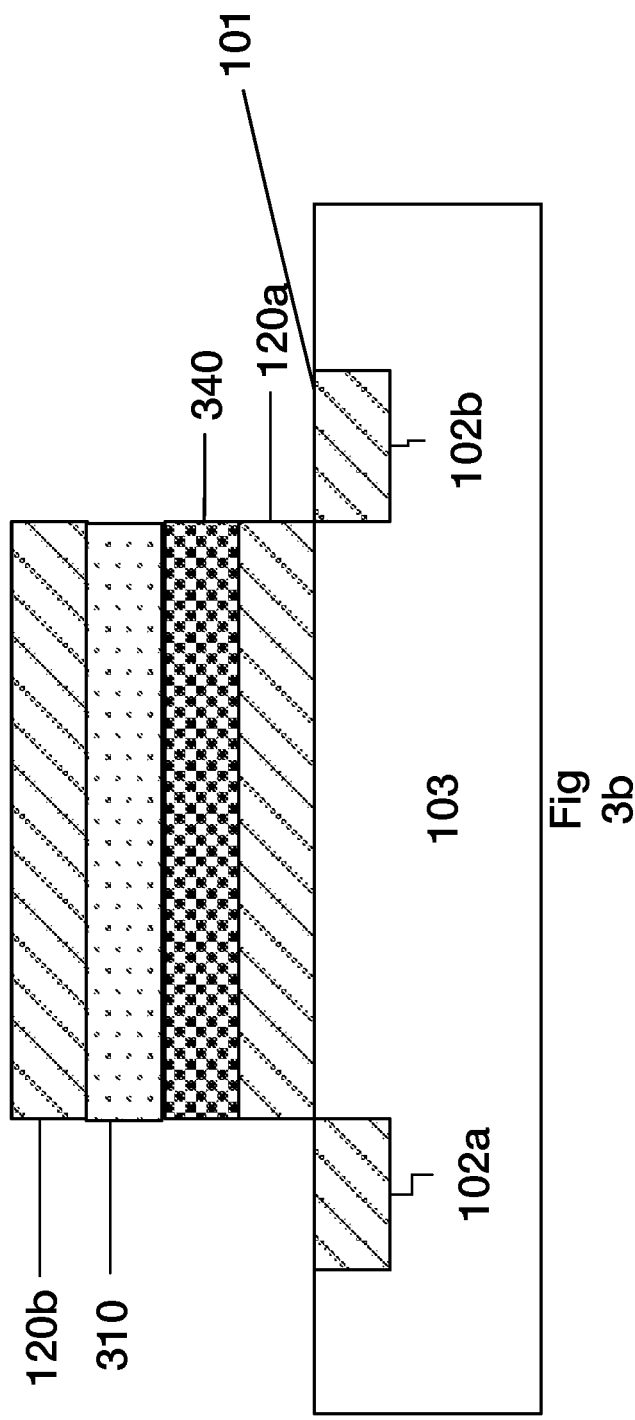
FIG. 3b illustrates a cross-sectional view of a second embodiment of the FeFET with an anti-ferroelectric layer in accordance with the invention.

FIG. 3b is an extension of FIG. 3a except that the order of the crystallized ferroelectric oxide 310 and the crystallized anti-ferroelectric oxide 340 are switched.

FIG. 3c is the same as FIG. 3a except that it shows the optional insulating buffer layer 108 included.

FIG. 3d is the same as FIG. 3b except that it shows the optional insulating buffer layer 108 included.

Figure 4A:
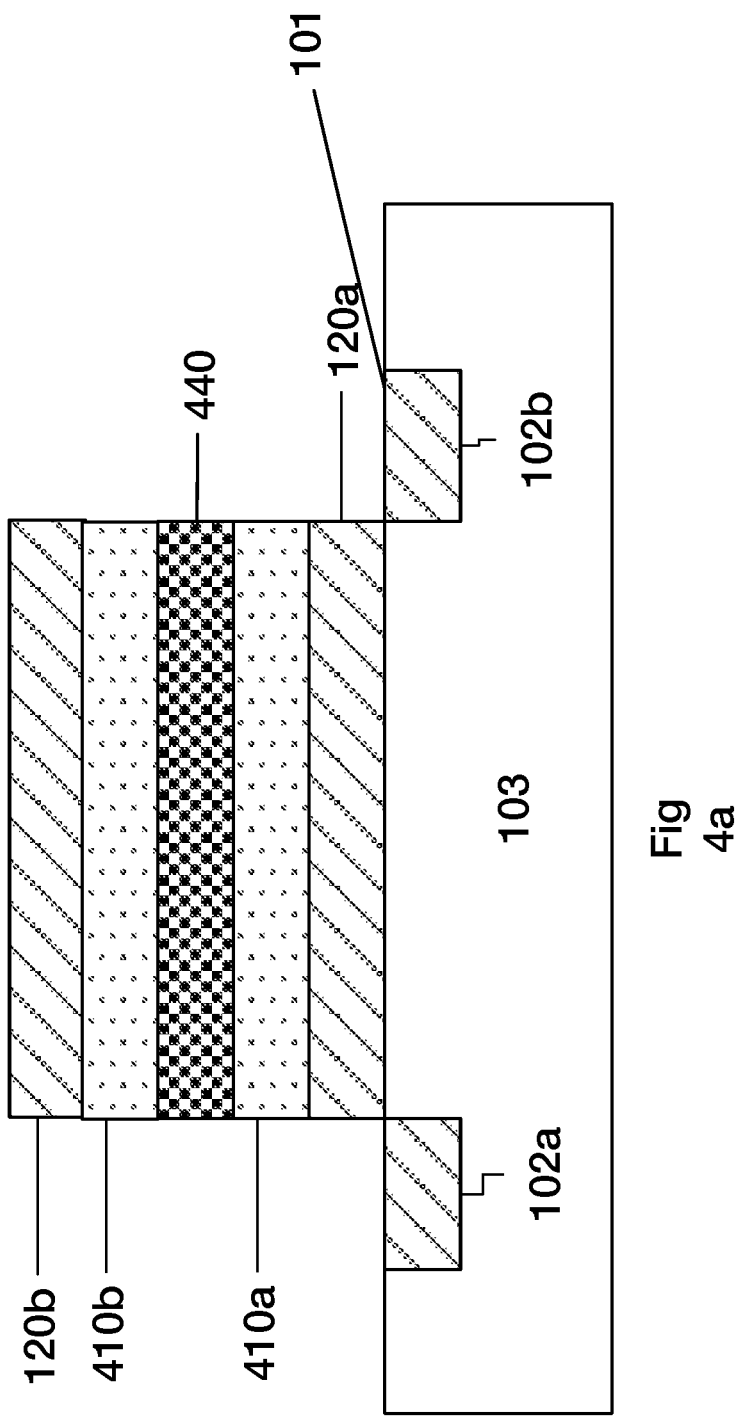
FIG. 4a illustrates a cross-sectional view of one embodiment of a MFM FeFET in accordance with the invention.

FIG. 4a illustrates another embodiment of the invention. In this embodiment, the source 102a, the drain 102b, and the carrier 103 are as previously described. Within the gate stack, there are several changes. The first is that the covering layer forms the first layer 120a and is then followed by a first crystallized ferroelectric oxide layer 410a, a crystallized anti-ferroelectric oxide layer 440, a second crystallized ferroelectric oxide layer 410b, and then another covering layer 120b.

The anti-ferroelectric layer 440 remains the same as described for 340 except for the thickness. In this case the thickness can vary from 1 Angstrom to 600 Angstroms. The added thickness is needed due to having two crystallized ferroelectric oxide layers. Since there are multiple ferroelectric oxide layers, the need for the crystallized anti-ferroelectric oxide trap charge is likewise increased. One method to accomplish this is to increase the thickness of the anti-ferroelectric oxide.

The first crystallized ferroelectric oxide layer 410a and second crystallized ferroelectric oxide layer 410b are as described for 210. They are differentiated from 210 in several ways.

In the embodiments illustrated in FIGS. 4a and 4b, each crystallized ferroelectric oxide layer 410a and 410b can be used to store separate polarization states. This means that each oxide layer acts as its own memory and can be programmed separately. Note that while this method of operation is possible, it may not be the desired behavior. For example, an application may desire that one oxide layer be programmed continuously and after it is fatigued, switch to the other oxide layer in order to increase the effective endurance per cell.

Another use of the illustrated embodiments is in using both cells together. Each ferroelectric crystallized oxide layer is capable of storing at least 4 phases (2 bits) per cell. If the entire cell is taken as one entity, the different combinations of the 4 phases between both cells can be taken to equate to 16 combinations of phases (or 4 bits) per cell. This effectively exponentially increases the amount of storage per cell.

The materials used in each crystallized ferroelectric oxide layer 410a and 410b are composed primarily of O and any of Hf, Zr, and (Hf, Zr). This means that the volumetric content per cell of these elements is higher compared to any other component or further additives. One who is skilled in the art will note that the concentration of additives is typically set within a range of 0.5% to 6.75%.

The exact material and concentration for each crystallized ferroelectric oxide layer 410a and 410b can be the same or different. As a non-limiting example, both layers 410a and 410b could be HfO2 with a 2% concentration of additives. As a further example 410a could be composed of HfO2 with a 2% concentration of additives and 410b could be ZrO2 with a 3% concentration of additives.

The thickness of each crystallized ferroelectric oxide layer 410a and 410b remains the same in that each layer can range in thickness from 1 Angstrom to 150 Angstroms. Note that the effective combined thickness of both first oxide and second oxide ranges from 2 Angstroms to 300 Angstroms.

FIG. 4b illustrates the same embodiment as FIG. 4a except that the optional insulating buffer layer 108 is included.

Although not illustrated, FIGS. 4a and 4b can be adapted such that layers 440 and 410b repeat n times to form 2n+1 total layers with n layers being anti-ferroelectric 440 and n+1 total layers being ferroelectric (i.e., 1 of 410a and n of 410b).

Figure 5A:
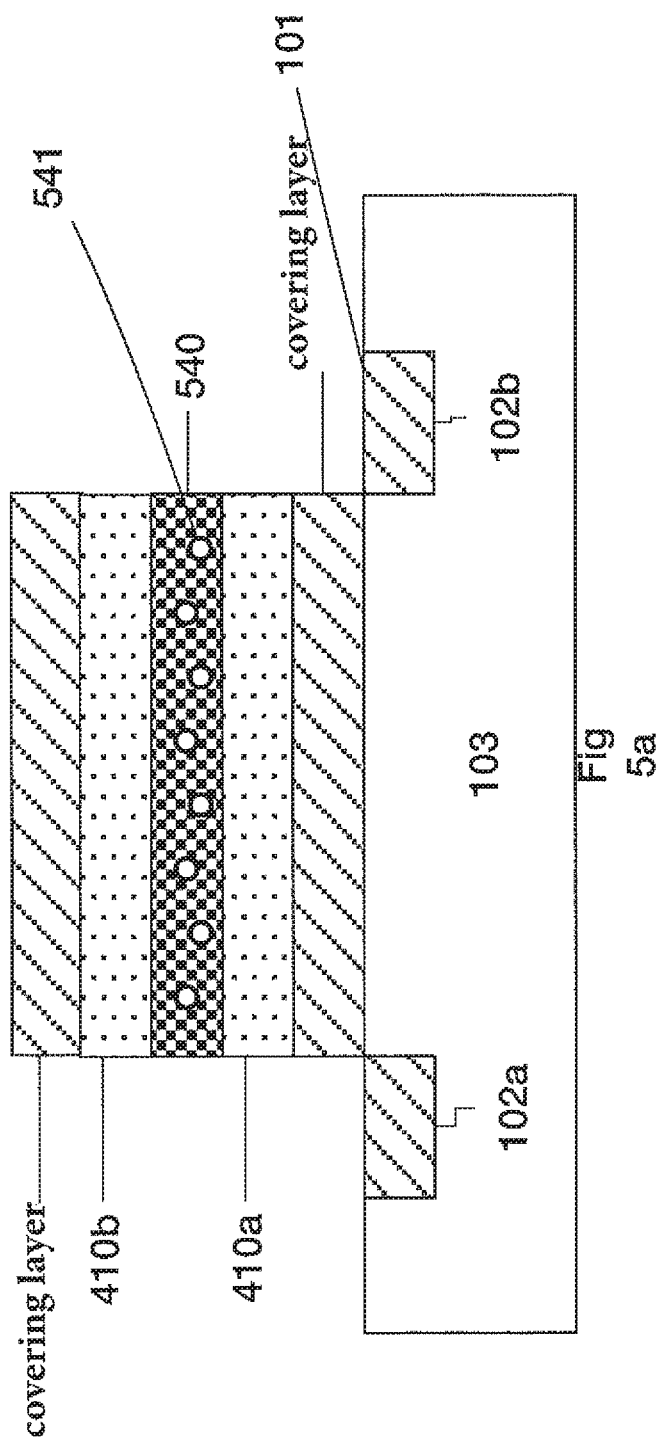
FIG. 5a illustrates a cross-sectional view of the embodiment of FIG. 4a with additional nano-dots.

FIG. 5a illustrates yet another embodiment of the invention. FIG. 5a builds off the same concept as FIG. 4a except that the crystallized anti-ferroelectric oxide layer 540 is different. In this embodiment nanodots 541 are embedded within the crystallized anti-ferroelectric oxide layer 540. Aside from the inclusion of nanodots, the formulation of the crystallized anti-ferroelectric oxide layer 540 remains unchanged as described for 440.

The concept of nanodots is well understood by one skilled in the art. One exemplary process for fabricating nanodots for use in embodiments of the present invention can be found in U.S. Pat. No. 6,320,784 to Muralidhar et al., the entire contents of which are hereby incorporated by reference as if set forth in their entirety herein. They are included in order to improve the performance of electrical properties within a system. In this embodiment crystallized ferroelectric nanodots are used.

The nanodots 541 are formed primarily of O and any of Hf, Zr, and (Hf, Zr). This means that the volumetric content per cell of these elements is higher compared to any other component or further additives. One who is skilled in the art will note that the concentration of additives is typically set within a range of 0.5% to 6.75%.

The use of the nanodots 541 within the crystallized anti-ferroelectric oxide layer 540 is used primarily as a means to improve the performance characteristics of the cell. Similar to the charge trapping anti-ferroelectric layers, the nanodots can be used to maintain the electrical characteristic performance of the cell.

FIG. 5b illustrates another embodiment of the invention discussed in FIG. 5a except that there is an optional insulating buffer layer 108 at the bottom of the gate stack.

Although not illustrated, FIGS. 5a and 5b can be adapted such that layers 540 and 510b repeat n times to form 2n+1 total layers with n layers being anti-ferroelectric 540 and n+1 total layers being ferroelectric (i.e., 1 of 510a and n of 510b).

Figure 6A:
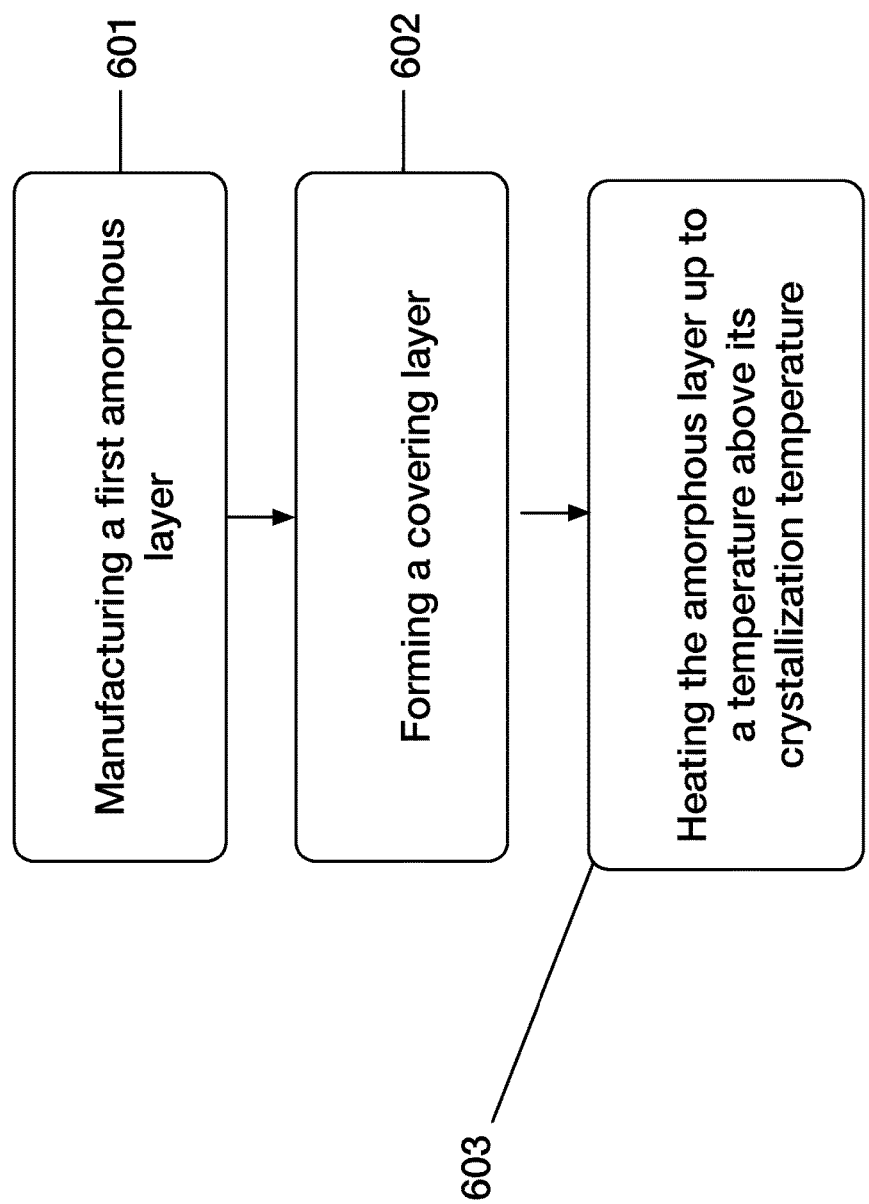
FIG. 6a illustrates a prior art method of manufacturing an integrated circuit containing a ferroelectric memory cell using the described materials.

FIG. 6a is a flowchart that illustrates a prior art method for manufacturing an integrated circuit including a ferroelectric memory cell. There are three main components to the prior method—forming an amorphous layer over a carrier, the amorphous layer comprising, as main components, O and any of the group of Hf, Zr, (Hf, Zr) (Step 601); manufacturing a covering layer on the amorphous layer (Step 602); and heating the amorphous layer to a temperature above its crystallization temperature either to: (a) at least partly alter its crystal state from amorphous to crystalline or (b) at least partly alter its electric state into a ferroelectric state (Step 603).

FIG. 6b is a flowchart that illustrates an inventive process for manufacturing an integrated circuit including a ferroelectric memory cell as depicted in FIGS. 2a to 2f. A first amorphous layer is formed over a carrier, the amorphous layer being from 1 Angstrom to 150 Angstroms in thickness and comprising, as main components, O and any of the group HF, ZF, (Hf, Zr), with further additives of a concentration within a range of 0.5% to 6.75% from the group C, Si, Al, Ge, Sn, Sr, Pb, Mg, Ca, Sr, Ba, Ti, Zr, Ti, and rare earth element (Step 621). A covering layer is formed on the amorphous layer, the covering being proportional to the thickness of the amorphous layer (Step 622). This is desirable because it uses less material, because the resulting device will be physically smaller, and because the voltage required to program the device will be reduced. Lastly, the amorphous layer is heated to a temperature proportional to its thickness above its crystallization temperature either to: (a) partly alter its crystal state from amorphous to crystalline or (b) partly alter its electric state into a ferroelectric state (Step 623).

Figure 6C:
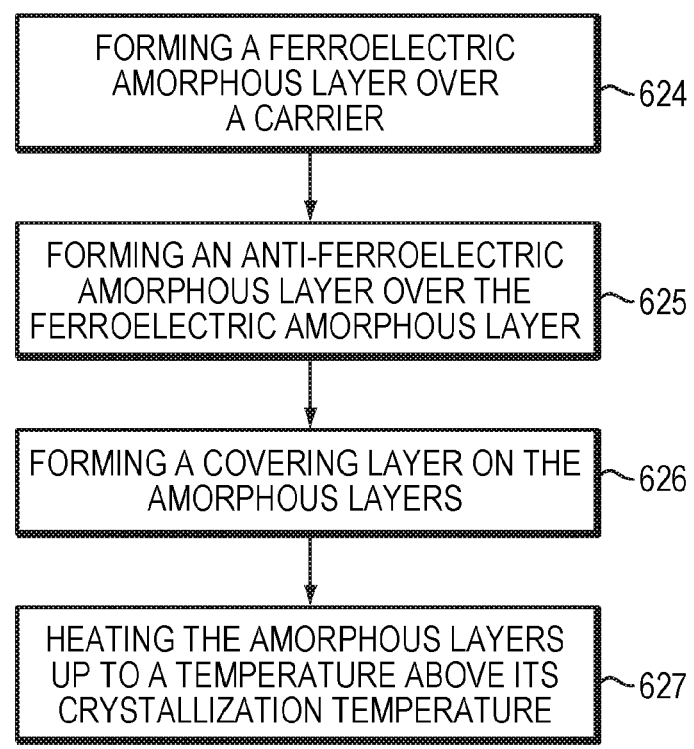
FIG. 6c illustrates one approach to manufacture an integrated circuit containing a ferroelectric memory cell based on the embodiments of FIGS. 3a to 3d.

FIG. 6c is a flowchart illustrating one embodiment of the process for manufacturing an integrated circuit including a ferroelectric memory cell as depicted in FIGS. 3a to 3d. A ferroelectric amorphous layer is formed over a carrier, the ferroelectric amorphous layer comprising as main components O and any of the group of Hf, Zr, (Hf, Zr) (Step 624). An anti-ferroelectric amorphous layer is formed over the ferroelectric amorphous layer, the anti-ferroelectric amorphous layer having as main components O and any of the group of Hf, Zr, (Hf, Zr) (Step 625). A covering layer is formed on the amorphous layers (Step 626). The amorphous layers are heated to a temperature above its crystallization temperature either to: (a) at least partly alter all crystal states from amorphous to crystalline or (b) at least partly alter their electric states into at least 1 ferroelectric state and at least 1 anti-ferroelectric state (Step 627).

In this embodiment either amorphous layer may be the ferroelectric or anti-ferroelectric layer. That is, e.g., 120a may be ferroelectric if 120b is anti-ferroelectric, or 120a may be anti-ferroelectric if 120b is ferroelectric.

Figure 6D:
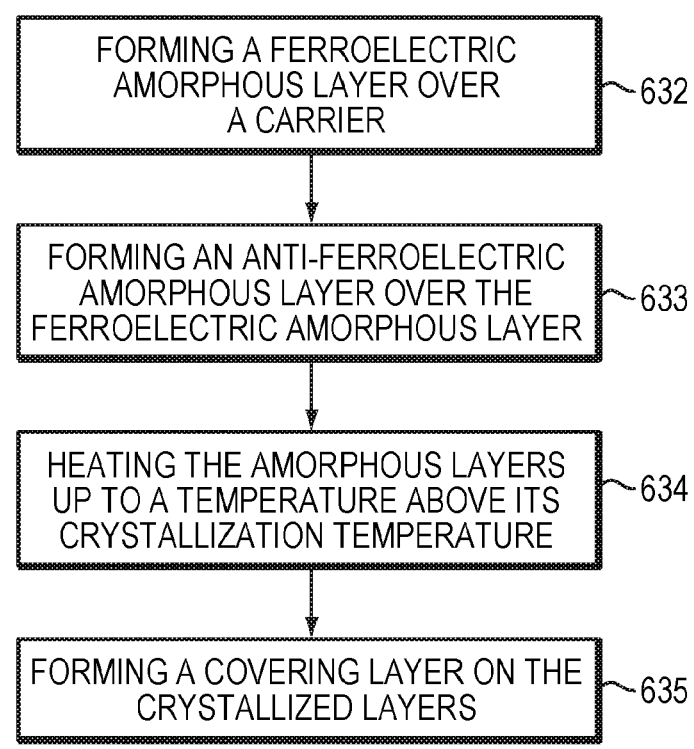
FIG. 6d illustrates another approach to manufacture an integrated circuit containing a ferroelectric memory cell based on the embodiments of FIGS. 3a to 3d.

FIG. 6d is a flowchart illustrating another embodiment of the process for manufacturing an integrated circuit including a ferroelectric memory cell as depicted in FIGS. 3a to 3d. A ferroelectric amorphous layer is formed over a carrier, the ferroelectric amorphous layer comprising as main components O and any of the group of Hf, Zr, (Hf, Zr) (Step 632). An anti-ferroelectric amorphous layer is formed over the ferroelectric amorphous layer, the anti-ferroelectric amorphous layer having as main components O and any of the group of Hf, Zr, (Hf, Zr) (Step 633). The amorphous layers are heated to a temperature above its crystallization temperature either to: (a) at least partly alter all crystal states from amorphous to crystalline or (b) at least partly alter their electric states into at least 1 ferroelectric state and at least 1 anti-ferroelectric state (Step 634). A covering layer is formed on the crystalline layers (Step 635).

Figure 6E:
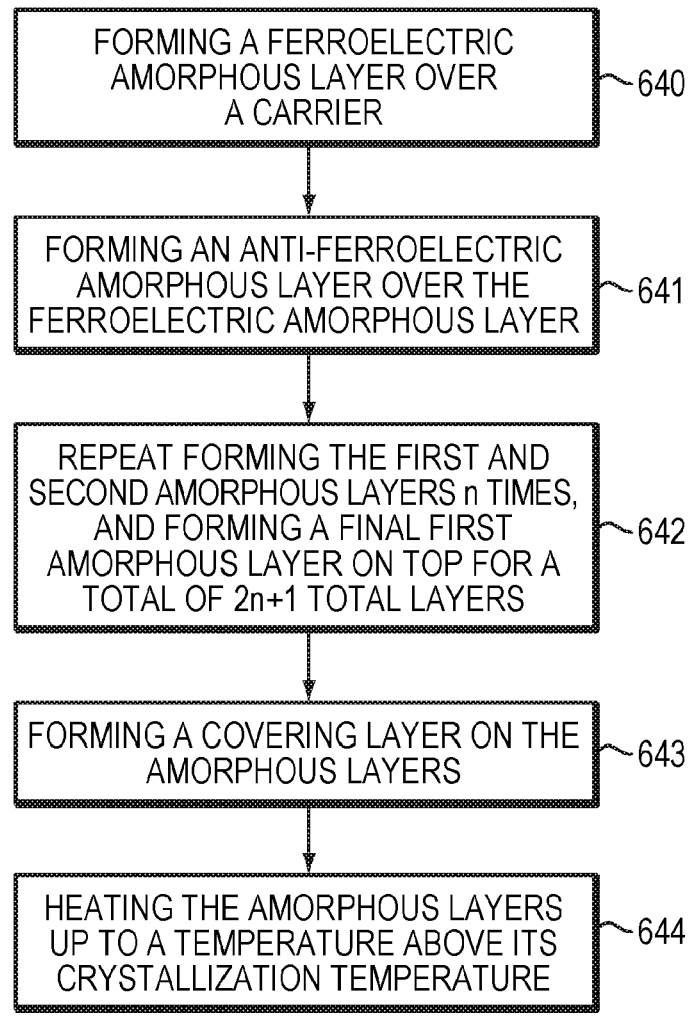
FIG. 6e illustrates one approach to manufacture an integrated circuit containing a ferroelectric memory cell based on the embodiments of FIGS. 4a and 4b.

FIG. 6e is a flowchart illustrating one embodiment of the process for manufacturing an integrated circuit including a ferroelectric memory cell as depicted in FIGS. 4a and 4b. A ferroelectric amorphous layer is formed over a carrier, the ferroelectric amorphous layer comprising as main components O and any of the group of Hf, Zr, (Hf, Zr) (Step 640). An anti-ferroelectric amorphous layer is formed over the ferroelectric amorphous layer, the anti-ferroelectric amorphous layer having as main components O and any of the group of Hf, Zr, (Hf, Zr) (Step 641). These first two steps are iterated n times, ending in the formation of a final amorphous layer on top for a total of 2n+1 layers (Step 642). A covering layer is formed on the amorphous layers (Step 643). The amorphous layers are heated to a temperature above their crystallization temperature either to: (a) at least partly alter all crystal states from amorphous to crystalline or (b) at least partly alter their electric states into at least 1 ferroelectric state and at least 1 anti-ferroelectric state (Step 644).

FIG. 6f is a flowchart illustration of another embodiment of the process for manufacturing an integrated circuit including a ferroelectric memory cell as depicted in FIGS. 4a and 4b. FIG. 6f differs from FIG. 6e in that one or more intermediate heating steps 645 are introduced. This step 645 is similar to step 644, in that it transforms the layers that have currently been deposited into ferroelectric or anti-ferroelectric layers. Once heating step 645 is completed, half the layers will be ferroelectric and half will be anti-ferroelectric.

Figure 6G:
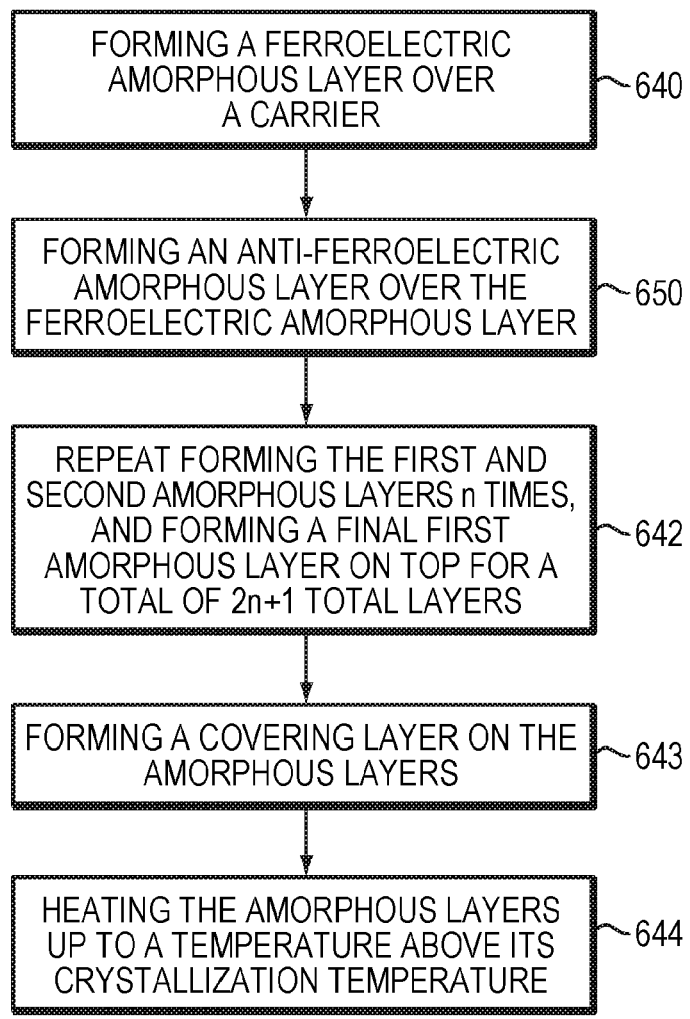
FIG. 6g illustrates one approach to manufacture an integrated circuit containing a ferroelectric memory cell based on the embodiments of FIGS. 5a and 5b.

FIG. 6g is a flowchart illustration of an embodiment of the process for manufacturing an integrated circuit including a ferroelectric memory cell as depicted in FIGS. 5a and 5b. FIG. 6g is similar to FIG. 6e except that Step 641 replaced with Step 650. In Step 650, the amorphous layer is formed to contain both anti-ferroelectric materials as well as ferroelectric nanodots. Heating step 644 crystallizes the layer with nanodots present.

Figure 6H:
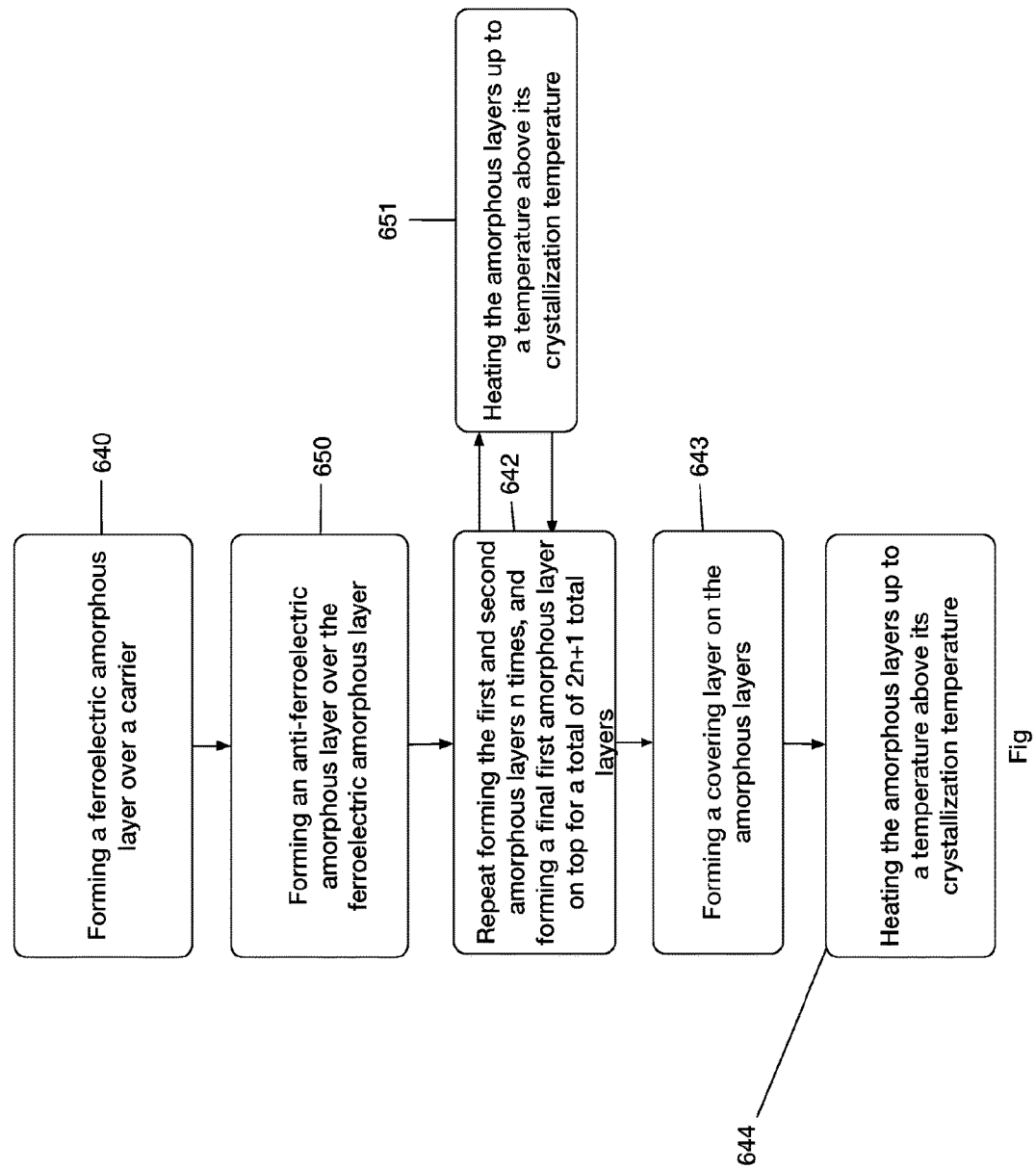
FIG. 6h illustrates another approach to manufacture an integrated circuit containing a ferroelectric memory cell based on the embodiments of FIGS. 5a and 5b.

FIG. 6h is a flowchart illustration of an embodiment of the process for manufacturing an integrated circuit including a ferroelectric memory cell as depicted in FIGS. 5a and 5b. FIG. 6h is FIG. 6f with Step 641 replaced with Steps 650 of FIG. 6g, i.e., including nanodots in the anti-ferroelectric layer(s). Additionally, intermediate heating step 651 occurs similarly to previous described intermediate heating step 645, but with the additional effect of placing the nanodots in a ferroelectric state.

While the specific embodiments disclosed are describing 1T or 1T-1C ferroelectric memory cells, it is to be understood that the methods and structures of the present invention can be applied to any suitable type of ferroelectric memory cells, including but not limited to 2T-2C, 3T-2C, and 3D FeFET.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising a ferroelectric memory cell, the ferroelectric memory cell comprising:
   a first oxide layer;
   a second oxide layer;
   a third oxide layer; and
   a covering layer on at least one oxide layer,
   wherein the first and third oxide layers comprise a material that is at least partly in a ferroelectric state and comprises, as main components, oxygen and any of the group consisting of: Hf, Zr, and (Hf, Zr); and
   wherein the second oxide layer is disposed between the first and third oxide layers; and
   wherein the second oxide layer comprises a material that has an antiferroelectric crystalline structure.

2. An integrated circuit comprising a ferroelectric memory cell, the ferroelectric memory cell comprising:
   a first oxide layer;
   a second oxide layer;
   a third oxide layer; and
   a covering layer on at least one oxide layer,
   wherein the first and third oxide layers comprise a material that is at least partly in a ferroelectric state and comprises, as main components, oxygen and any of the group consisting of: Hf, Zr, and (Hf, Zr);
   wherein the second oxide layer is disposed between the first and third oxide layers; and
   wherein the second oxide layer is an amorphous layer with antiferroelectric crystalline inclusions.

3. The integrated circuit of claim 1 wherein the first and third oxide layers comprise further additives of a concentration within a range of 0.5% to 6.75% and the additives are at least one of the C, Si, Al, Ge, Sn, Sr, Pb, Mg, Ca, Sr, Ba, Ti, Zr, and one or more rare earth elements.

4. The integrated circuit of claim 1 wherein:
   the second oxide layer overlies the first; and
   the third oxide layer overlies the first and second; and
   the covering layer comprises at least one of TiN, TaN, TaCN, WCN, Ru, Re, RuO, Pt, Ir, IrO Ti, TiAlN, TaAlN, W, WN, C, Si, Ge, SiGe, and NbCN.

5. The integrated circuit of claim 1 wherein the second oxide layer contains nanodots comprising a ferroelectric material that is at least partly in a ferroelectric state and comprising, as main components, oxygen and any of the group consisting of: Hf, Zr, and (Hf, Zr).

6. The integrated circuit of claim 1 wherein the second oxide layer comprises further additives of a concentration within a range of 0.5% to 20% and the additives are at least one of the C, Si, Al, Ge, Sn, Sr, Pb, Mg, Ca, Sr, Ba, Ti, Zr, and one or more rare earth elements.

7. The integrated circuit of claim 1 wherein the thicknesses of the first and third oxide layers are in the range of 1 Angstrom to 150 Angstroms.

8. The integrated circuit of claim 1 wherein the first and third oxide layers are about the same thickness.

9. The integrated circuit of claim 1 wherein the first and third oxide layers have different thicknesses.

10. The integrated circuit of claim 1 wherein the first and third oxide layers have separate polarization states.

11. The integrated circuit of claim 1 wherein the second and third oxide layers form a stacking layer; and
   wherein a plurality of stacking layers forms a system that overlies the first oxide layer; and
   wherein the orientation of the stacking layers is such that a second oxide layer is always adjacent to a first or third oxide layer.

12. The integrated circuit of claim 11 wherein the first oxide layer and each stacking layer have separate polarization states.

13. The integrated circuit of claim 2 wherein the first and third oxide layers comprise further additives of a concentration within a range of 0.5% to 6.75% and the additives are at least one of the C, Si, Al, Ge, Sn, Sr, Pb, Mg, Ca, Sr, Ba, Ti, Zr, and one or more rare earth elements.

14. The integrated circuit of claim 2 wherein the first oxide layer overlies the second and third oxide layers, and the covering layer comprises at least one of TiN, TaN, TaCN, WCN, Ru, Re, RuO, Pt, Ir, IrO, Ti, TiAlN, TaAlN, W, WN, C, Si, Ge, SiGe, and NbCN.

15. The integrated circuit of claim 2 wherein the thicknesses of the first and third oxide layers are in the range of 1 Angstrom to 150 Angstroms.

16. The integrated circuit of claim 2 wherein the first and third oxide layers are about the same thickness.

17. The integrated circuit of claim 2 wherein the first and third oxide layers have different thicknesses.

18. The integrated circuit of claim 2 wherein the first and third oxide layer have separate polarization states.

* * * * *